United States Patent
Fukada et al.

(10) Patent No.: US 10,897,372 B2
(45) Date of Patent: Jan. 19, 2021

(54) COMMUNICATION DEVICE, COMMUNICATION SYSTEM, COMMUNICATION METHOD AND PROGRAM

(71) Applicant: Sony Corporation, Tokyo (JP)

(72) Inventors: Hiroyuki Fukada, Kanagawa (JP); Takahiro Furuya, Kanagawa (JP)

(73) Assignee: Sony Corporation, Tokyo (JP)

( * ) Notice: Subject to any disclaimer, the term of this patent is extended or adjusted under 35 U.S.C. 154(b) by 168 days.

(21) Appl. No.: 15/739,461

(22) PCT Filed: Apr. 25, 2016

(86) PCT No.: PCT/JP2016/002167
§ 371 (c)(1),
(2) Date: Dec. 22, 2017

(87) PCT Pub. No.: WO2017/002291
PCT Pub. Date: Jan. 5, 2017

(65) Prior Publication Data
US 2018/0183617 A1 Jun. 28, 2018

(30) Foreign Application Priority Data
Jul. 2, 2015 (JP) .................................. 2015-133301

(51) Int. Cl.
*H03M 13/00* (2006.01)
*H04L 12/18* (2006.01)
(Continued)

(52) U.S. Cl.
CPC ........ *H04L 12/189* (2013.01); *G06F 11/1004* (2013.01); *H03M 13/3761* (2013.01);
(Continued)

(58) Field of Classification Search
CPC ....... H04L 12/189; H04L 1/00; H04L 1/0045; H04L 1/0041; H04L 1/0076;
(Continued)

(56) References Cited

U.S. PATENT DOCUMENTS 6,307,837 B1 * 10/2001 Ichikawa ............ H04L 63/0236
370/230
2011/0083035 A1 * 4/2011 Liu ........................ H04L 1/1819
714/4.1
(Continued)

FOREIGN PATENT DOCUMENTS

| JP | 2002-141856 A | 5/2002 |
| JP | 2011-019118 A | 1/2011 |
| WO | WO 2014/129044 A1 | 8/2014 |

OTHER PUBLICATIONS

Written Opinion and English translation thereof dated Jun. 7, 2016 in connection with International Application No. PCT/JP2016/002167.

(Continued)

*Primary Examiner* — Samir W Rizk
(74) *Attorney, Agent, or Firm* — Wolf, Greenfield & Sacks, P.C.

(57) ABSTRACT

A communication device includes: a function of receiving an information packet transmitted from a base station; a communication function of connecting to a local network for sharing information among a plurality of terminals; a function of generating a parity packet; a function of multicasting the generated parity packet and identification information of all source packets to the local network; a function of receiving the parity packet multicast by other terminals and the identification information of all source packets via the local network; a function of storing the received parity packet and the identification information of all source packets in a storage unit; and a function of recovering a lost
(Continued)

packet using the parity packet and the identification information of all source packets.

19 Claims, 29 Drawing Sheets

(51) Int. Cl.
| | |
|---|---|
| *H04L 1/00* | (2006.01) |
| *H03M 13/37* | (2006.01) |
| *G06F 11/10* | (2006.01) |
| *H04L 29/08* | (2006.01) |
| *H03M 13/11* | (2006.01) |
| *H03M 13/15* | (2006.01) |
| *H04W 88/08* | (2009.01) |

(52) U.S. Cl.
CPC .............. *H04L 1/00* (2013.01); *H04L 1/0041* (2013.01); *H04L 1/0045* (2013.01); *H04L 1/0076* (2013.01); *H04L 69/324* (2013.01); *H03M 13/1102* (2013.01); *H03M 13/152* (2013.01); *H03M 13/1515* (2013.01); *H04L 2001/0093* (2013.01); *H04L 2001/0097* (2013.01); *H04W 88/08* (2013.01)

(58) Field of Classification Search
CPC ......... H03M 13/3761; H03M 13/1102; H03M 13/1515; H03M 13/152
See application file for complete search history.

(56) References Cited

U.S. PATENT DOCUMENTS

2011/0099446 A1* 4/2011 Murakami ............ H04L 1/0041
714/748
2015/0381314 A1* 12/2015 Tomisawa ............. H04L 1/1819
714/776

OTHER PUBLICATIONS

International Preliminary Report on Patentability and English translation thereof dated Jan. 11, 2018 in connection with International Application No. PCT/JP2016/002167.
International Search Report and English translation thereof dated Jun. 7, 2016 in connection with International Application No. PCT/JP2016/002167.
Hori et al., A Study on Application of the Erasure Correcting Code to Wireless LAN Systems, IEICE Technical Report, Feb. 27, 2014, vol. 113, No. 465, pp. 7-10.

* cited by examiner

COMMUNICATION DEVICE, COMMUNICATION SYSTEM, COMMUNICATION METHOD AND PROGRAM

CROSS-REFERENCE TO RELATED APPLICATIONS

This application claims the benefit under 35 U.S.C. § 371 as a U.S. National Stage Entry of International Application No. PCT/JP2016/002167, filed in the Japanese Patent Office as a Receiving Office on Apr. 25, 2016, which claims priority to Japanese Patent Application Number JP2015-133301, filed in the Japanese Patent Office on Jul. 2, 2015, each of which is hereby incorporated by reference in its entirety.

TECHNICAL FIELD

The present disclosure relates to a communication device, a communication system, a communication method, and a program applied to broadcasting and mobile radio communication.

BACKGROUND ART

A space diversity scheme (an antenna selection scheme) which preferentially uses radio signals received by an antenna in good radio wave conditions among the same radio signals received by a plurality of antennas in order to improve the quality of communication is known. Moreover, a scheme in which a base station is made to retransmit data that could not have been received is also known.

In these schemes, a network needs to be secured between a base station and a receiver. Due to this, these schemes cannot be used in a case where it is difficult to secure a network. In order to cope with such a problem, a scheme in which a plurality of receivers forms a network so that broadcast data is shared among the plurality of receivers and data that could not have been received from other receivers is collected via the network is proposed (see Patent Document 1).

CITATION LIST

Patent Document

Patent Document 1: Japanese Patent Application Laid-Open No. 2002-141856

SUMMARY OF THE INVENTION

Problems to be Solved by the Invention

The scheme disclosed in Patent Document 1 has the following problems.

First, control is complex. That is, it is necessary to grasp missing packets on the basis of management information necessary for reconstructing packets and information possessed by the packets stored in a storage device and control exchange when transmitting and receiving the missing packets among radio receivers.

Second, the traffic of a local network used for sharing data is large. That is, it is necessary to deliver information on a terminal which possesses the missing packets, which incurs an increase in the traffic on a local network. Moreover, it is necessary to transmit missing packets of respective terminals, which incurs an increase in the traffic on a local network.

Third, there is a limitation on the number of terminals. That is, since the traffic increases as the number of terminals increases, the number of terminals is limited according to the communication capacity of the local network.

Therefore, an object of the present disclosure is to provide a communication device, a communication system, a communication method, and a program capable of solving these problems.

Solutions to Problems

In order to solve the problems described above, the present disclosure provides a communication device including: a function of receiving an information packet transmitted from a base station; a communication function of connecting to a local network for sharing information among a plurality of terminals; a function of generating a parity packet; and a function of multicasting the generated parity packet and identification information of all source packets to the local network.

The present disclosure also provides a communication device including: a function of receiving an information packet transmitted from a base station; a function of receiving a parity packet multicast by other terminals and identification information of all source packets via a local network; a function of storing the received parity packet and the identification information of all source packets in a storage unit; and a function of recovering a lost packet using the parity packet and the identification information of all source packets.

The present disclosure also provides a communication device including: a function of receiving an information packet transmitted from a base station; a communication function of connecting to a local network for sharing information among a plurality of terminals; a function of generating a parity packet; a function of multicasting the generated parity packet and identification information of all source packets to the local network; a function of receiving the parity packet multicast by other terminals and the identification information of all source packets via the local network; a function of storing the received parity packet and the identification information of all source packets in a storage unit; and a function of recovering a lost packet using the parity packet and the identification information of all source packets.

The present disclosure also provides a communication system including: a plurality of terminals that receives an information packet multicast or broadcast from a base station; and a network for sharing information among the plurality of terminals, in which the plurality of terminals shares a parity packet by mutually transmitting and receiving the parity packet a plurality of times so that an information packet which could not have been received correctly by respective terminals is recovered.

The present disclosure also provides a communication method including: allowing a plurality of terminals to receive an information packet multicast or broadcast from a base station so that information is shared among the plurality of terminals via a network; and allowing the plurality of terminals to share a parity packet by mutually transmitting and receiving the parity packet a plurality of times so that an information packet which could not have been received correctly by respective terminals is recovered.

The present disclosure also provides a program for causing a computer to execute a communication method including: a step of receiving an information packet transmitted from a base station; a communication step of connecting to a local network for sharing information among a plurality of terminals; a step of generating a parity packet; a step of multicasting the generated parity packet and identification information of all source packets to the local network; a step of receiving the parity packet multicast by other terminals and the identification information of all source packets via the local network; a step of storing the received parity packet and the identification information of all source packets in a storage unit; and a step of recovering a lost packet using the parity packet and the identification information of all source packets.

Effects of the Invention

According to at least one embodiment, each terminal does not need to know lost information of other terminals and to transmit control information thereof. Moreover, a parity packet is generated from received data and is multicast to respective terminals. Since errors and lost portions in respective terminals are different probabilistically, it is possible to recover errors and lost portions in a plurality of terminals simultaneously using one parity packet. Therefore, the communication capacity consumption of the local network is small. Furthermore, respective terminals do not have to know mutual lost data, and the recovery function can be achieved simultaneously in a plurality of terminal using a parity packet. Moreover, all terminals receive the same parity packet simultaneously by sharing the parity packet using multicasting and a lost packet can be recovered simultaneously. Therefore, the load on the local network does not depend on the number of terminals, and the number of terminals is not limited depending on the communication capacity of the local network unlike the conventional technique. It should be noted that the effects described herein are not necessarily limited and any one of the effects described herein may be produced. Moreover, the content of this invention is not limited by the effects illustrated in the following description.

MODE FOR CARRYING OUT THE INVENTION

The embodiments described below are suitable specific examples of this invention, and includes technically preferred various limitations. However, the scope of this invention is not limited to these embodiments, unless limitations to this invention are particularly stated in the description below.

Note that the description of the present disclosure will be provided in the following order.
<1. Overview of Present Disclosure>
<2. First Embodiment>
<3. Second Embodiment>
<4. Modification>

1. Overview of Present Disclosure

Figure 1:
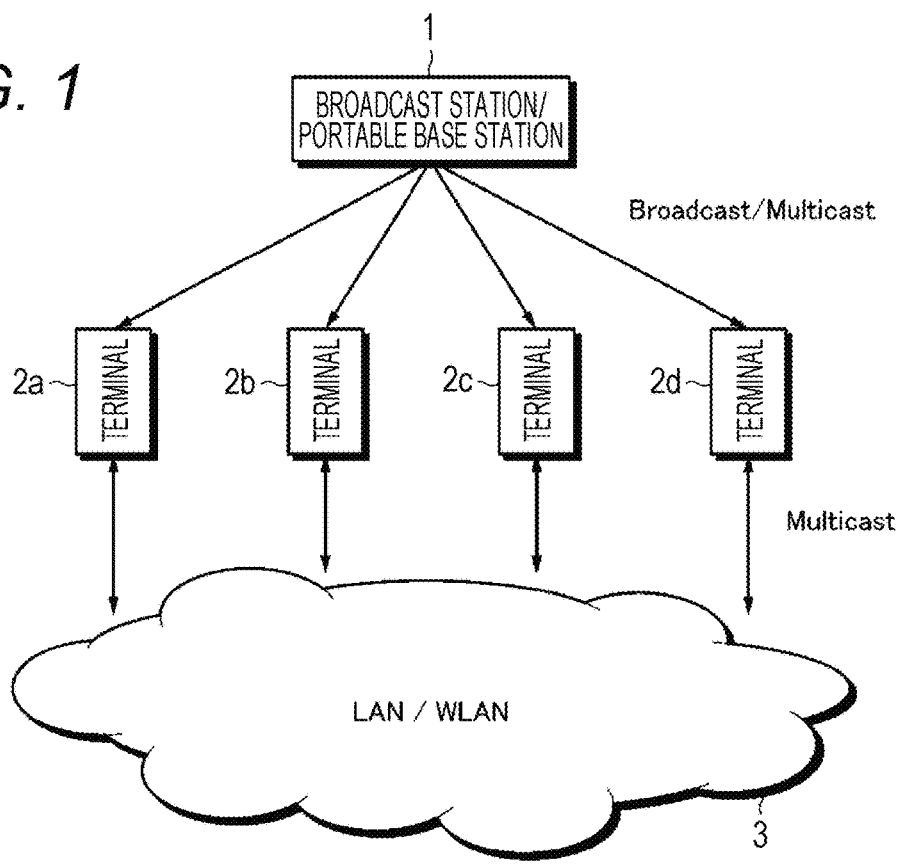
FIG. 1 is a block diagram used for description of a system according to the present disclosure.

An overview of the present disclosure will be described with reference to FIG. 1. A base station (a broadcast station or a portable base station) 1 multicasts or broadcasts information data (for example, broadcast data). A plurality of (for example, four) terminals 2a, 2b, 2c, and 2d which are radio communication devices receives information packets of the broadcast data (these terminals will be referred to simply as terminals 2 in a case where it is not particularly necessary to distinguish the terminals from each other). The multicasting or broadcasting from the base station may be realized by unicasting the same broadcast data from the base station to all terminals 2. An example of the terminal 2 is a multi-functional portable phone (a smartphone), a set-top box, a television receiver, and the like.

The terminal 2 selects one or a plurality of information packets among information packets which could have been received correctly or could have been recovered and generates a parity packet by calculating an exclusive logical sum of the respective bits of the selected information packets. The generated parity packet and the identification information of the source packet are multicast on a local network 3 so that the parity packet is shared among the plurality of terminals 2. The local network 3 is a network capable of performing multicast transmission, and for example, is a cable local area network (LAN) ora wireless local area network (LAN) capable of performing Internet protocol (IP) multicast transmission.

Although each terminal receives information packets every second, an error or a loss (hereinafter referred to simply as a loss) occurs in probabilistically different information packets in respective terminals. In order to recover such a loss, the parity generated from the information packet is shared between different terminals 2. One parity packet may achieve a recovery function with respect to different items of information data of the plurality of terminals 2. By sharing a plurality of such parity packets, a lost information packet can be recovered with high probability.

According to data sharing based on multicast of a parity packet multicast, respective terminals do not need to understand the respective error states (in which terminal and information packet an error has occurred), and it is possible to achieve a recovery function in the plurality of terminals 2 at the same time.

For application to a current broadcasting system, it is necessary to generate a parity for a moving picture experts group phase 2 (MPEG2)-transport stream (TS) packet (or a combination thereof). In this case, it is necessary to assign identification information uniquely from MPEG2-TS reception data only (that is, a method capable of assigning the same number to respective terminals is required). In a case where this number assigning method is applied to a current broadcasting system, a method of creating identification information using a program clock reference (PCR) or a continuity counter in MPEG2-TS, the number of a radio frame via which a TS packet is transmitted, a counter value for jitter removal transmitted simultaneously, and the like may be used.

Moreover, in a case where an information packet from a base station is transmitted using a real-time transport protocol (RTP), a sequence number or a timestamp in an RTP packet header can be used as an identification information. Since such a sequence number or timestamp generally has a successive value between packets transmitted successively (the sequence number and the timestamp has a fixed difference between successive packets), it is possible to know a transmission order of information packets that the terminal 2 receives from the base station 1 every second and the presence of a lost packet.

For example, in a case where the sequence number of the RTP is used as identification information, the RTP sequence number of an information packet which has been received correctly is used as the identification information of the information packet. If there is a lost number in the RTP sequence numbers of a series of information packets which have been received, since the lost RTP sequence number is the RTP sequence number of the lost information packet, it is possible to determine the identification information of the lost information packet.

Without being limited to the examples of the MPEG2-TS and the RTP, arbitrary information which can be determined uniquely between terminals can be used as identification information of respective information packets.

2. First Embodiment

Figure 2:
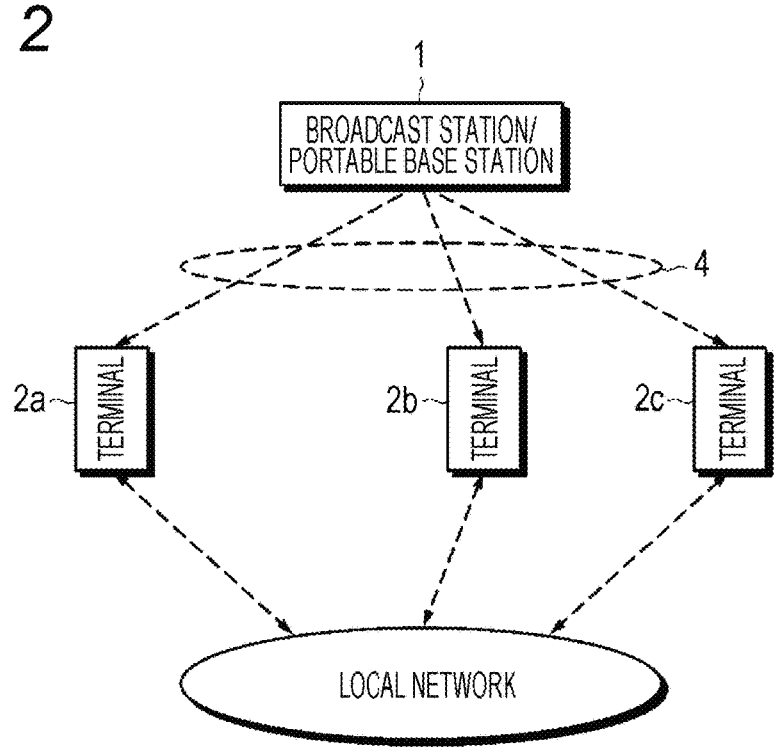
FIG. 2 is a block diagram illustrating an entire configuration of a first embodiment of the present disclosure.

A first embodiment of the present disclosure will be described. FIG. 2 illustrates an entire configuration of the first embodiment. Similarly to FIG. 1, a base station (a broadcast station or a portable base station) 1 multicasts or broadcasts information data (for example, broadcast data) via a medium (a radio communication medium) 4. A plurality of (for example, three) terminals 2a, 2b, and 2c (these terminals will be referred to simply as terminals 2 in a case where it is not particularly necessary to distinguish the terminals from each other) which are radio communication devices receive information packets of the broadcast data.

The terminals 2 are provided so as to communicate with each other via a local network 3. The terminal 2 selects one or a plurality of information packets among information packets which could have been received correctly or could have been recovered and generates a parity packet by calculating an exclusive logical sum of the respective bits of the selected information packet. An information packet used for generating the parity packet is referred to as a source information packet. A set of items of identification information of the source information packets is referred to as a coding vector. The generated parity packet and the identification information of the source packet are multicast on a local network 3 so that the parity packet is shared among the plurality of terminals 2.

The terminal 2 which is a radio communication device has the following functions.

(1) A function of receiving an information packet transmitted from the base station 1;

(2) A function of generating a parity packet and a coding vector from the information packet.

(3) A function of multicasting the generated parity packet and coding vector to the local network.

(4) A function of receiving parity packets and coding vectors multicast by other terminals via the local network and storing the parity packets and coding vectors.

(5) A function of recovering a lost information packet using the stored parity packets and coding vectors.

Figure 3:
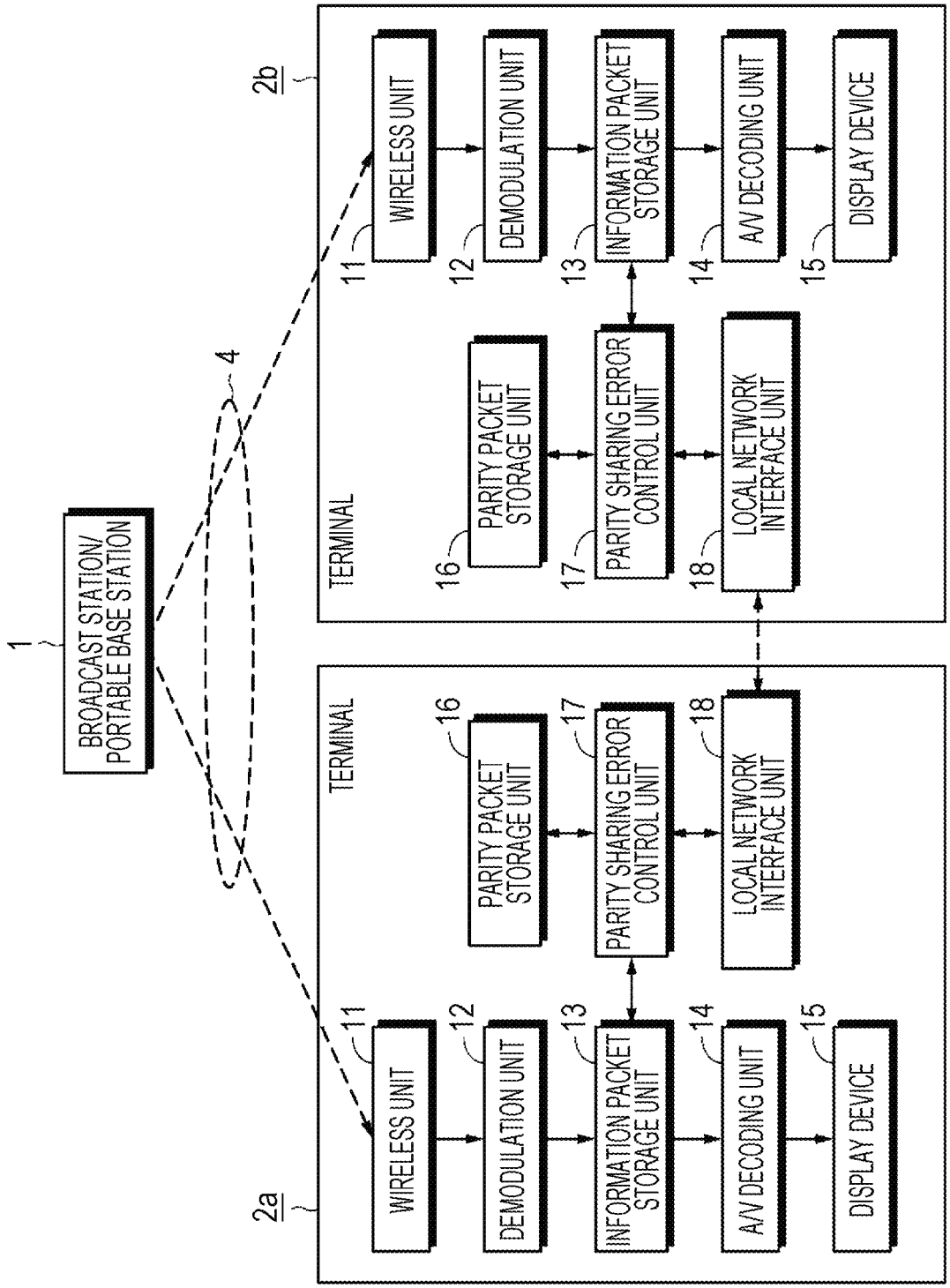
FIG. 3 is a block diagram illustrating an entire configuration and a configuration of a terminal.

FIG. 3 illustrates a configuration of the terminal 2 according to the first embodiment. For simplicity, two terminals 2a and 2b only are illustrated. Since the terminals 2a and 2b have the same configuration, the terminal 2a will be described, the components corresponding to the terminal 2b will be expressed as the same reference numerals as the terminal 2a, and the redundant description thereof will be omitted.

A wireless unit 11 of the terminal 2 performs radio communication with the base station 1 via a medium 4. Data is transmitted from the base station 1 and the terminal 2 receives the transmitted data. For example, the wireless unit 11 has an antenna function and an RF tuner function. A demodulation unit 12 that demodulates the reception data of the wireless unit 11 is provided, and the demodulation unit 12 outputs an MPEG2-TS packet, for example. In the present embodiment, even in a case where the reception state worsens due to fading or the like, the same number of TS packets as the number of packets transmitted by the base station 1 is output from the demodulation unit 12 at fixed intervals as error packets or the like.

The TS packets output from the demodulation unit 12 are stored in an information packet storage unit 13. Note that identification information for identifying packets is appended to the TS packets. The TS packets are supplied to an A/V decoding unit 14 and video data V and audio data A are demodulated. The video data V and the audio data A are supplied to a display device 15 and a video and an audio are reproduced by the display device 15.

A parity packet storage unit 16 that stores the parity packet is provided. The information packet storage unit 13 and the parity packet storage unit 16 are connected to a parity sharing error control unit 17. The parity sharing error control unit 17 has the characteristic functions of the present disclosure. The parity sharing error control unit 17 performs a process of encoding the received information packets and a process of recovering a lost information packet using the parity packets obtained from other terminals. A parity generation method and a decoding method based on other general forward error correction code (ECC) may be applied in addition to the parity generation method and the decoding method described in the present embodiment. The operation of the parity sharing error control unit 17 will be described with reference to FIGS. 4 and 5.

Figure 4:
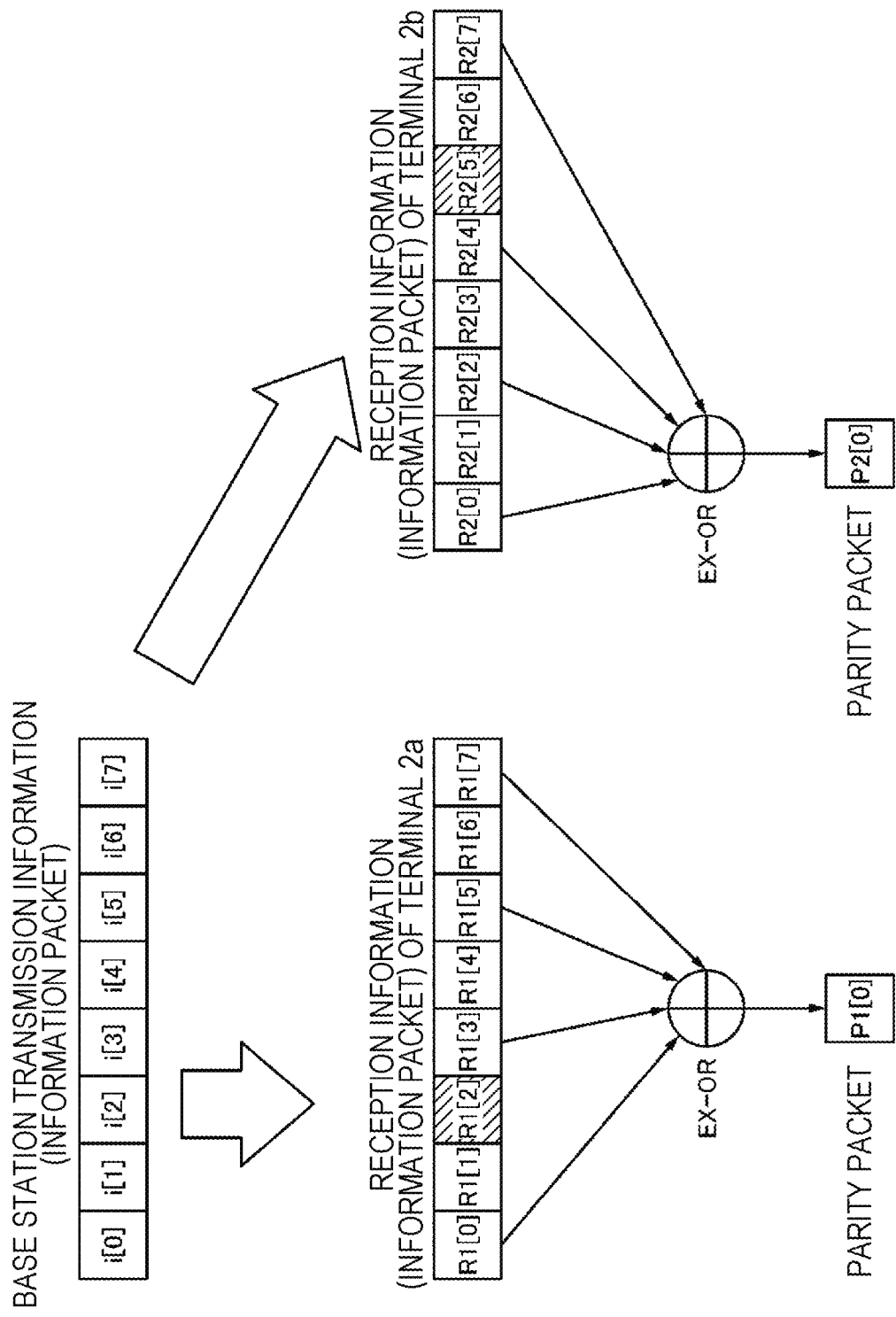
FIG. 4 is a schematic diagram for describing an operation of the present disclosure.

FIG. 4 is a diagram for describing transmission of an information packet from the base station 1 and generation of a parity packet in the terminal 2, and the following operations are performed.

(1) Transmission of an Information Packet from the Base Station 1 and Generation of Packets in a Terminal (i) Information packets i[0], i[1], i[2], i[3], i[4], i[5], i[6], i[7] are transmitted from the base station 1. The identification information of the information packet i[x] is x. For example, the identification information of i[7] is 7.

(ii) In the terminal 2a, reception packets R1[0], R1[1], . . . , R1[7] corresponding to the packets i[0], i[1], . . . , i[7] transmitted from the base station 1 are received. However, the received information packet R1[2] indicated by hatching is a lost packet. For example, it is possible to detect a loss in respective packets and a flag indicating a loss is formed in respective packets. The received information packets are stored in the information packet storage unit 13. The identification information of R1[x] is x. For example, the identification information of R1[7] is 7.

(iii) In the terminal 2b, similarly to the terminal 2a, information packets R2[0], R2[1], . . . , R2[7] corresponding to the packets transmitted from the base station 1 are received and stored. However, the information packet R2[5] indicated by hatching is a lost packet. The identification information of R2 [x] is x. For example, the identification information of R2[7] is 7.

(2) Generation of Parity Packet (i) In the terminal 2a, the parity sharing error control unit 7 generates a parity packet. One of a plurality of information packets are selected from information packets which could have been received correctly or could have been recovered, and a parity packet is generated by calculating an exclusive logical sum of the respective bits of the selected information packets (referred to as source information packets). A predetermined number (four in the example of FIG. 4) of source information packets R1[0], R1[3], R1[5], and R1[7] are selected randomly from the received information packets (non-lost information packets) and the exclusive logical sum (expressed as EX-OR in the drawing) of the respective bits is calculated. The result is a parity packet P1[0]. Moreover, a set of items of identification information {0, 3, 5, 7} of all source information packets used for generating the parity packet P1[0] is appended to the parity packet P1[0] as a coding vector.

In a more general expression, a parity packet generated in the N-th order (the first parity packet is the 0-th order) by the terminal 2a is expressed as P1[N], and the coding vector of P1[N] is expressed as V1[N]. The coding vector V1[N] is a vector value that may have one or a plurality of elements.

Each element of V1[N] is the identification information of the source parity packet, and each element is expressed as V1[N]={v1[N, 0], v1[N, 1], . . . v1[N, d1[N]−1]}. Here, d1[N] is the number of source information packets used for generation of the N-th parity packet P1[N]. A set of information packets (information packets which have been received correctly from the base station 1 or have been recovered) that are not lost in the terminal 2a can be expressed as S1: that is, S1={R1 [x]|R1[x] is not lost}.

In short, the N-th parity packet P1[N] of the terminal 2a can be generally expressed as follows.

$$S1=\{R1[x]|R1[x] \text{ is not lost}\}$$

$$V1[N]=\{v1[N,0],v1[N,1],\ldots,v1[N,d1[N]-1]\}$$

$$P1[N]=R1[v1[N,0]]+R1[v1[N,1]]+\ldots+R1[v1[N,d1[N]-1]]$$

Here, the symbol "+" in the expression of P1[N] means an operation of the exclusive logical sum of respective bits in the packet.

The example of the terminal 2a in FIG. 4 can be expressed as follows.

$$S1=\{R1[0],R1[1],R1[3],R1[4],R1[5],R1[6],R1[7]\}$$

$$V1[0]=\{v1[0,0],v1[0,1],v1[0,2],v1[0,3]\}=\{0,3,5,7\}$$

$$P1[0]=R1[0]+R1[3]+R1[5]+R1[7]$$

$$d1[0]=4$$

(ii) Similarly, in the terminal 2b, a parity packet P2 [0] is generated, and a set of items of identification information {0, 2, 4, 7} of the source packet used for generation of the parity packet P2[0] is appended to P2[0] as a coding vector of P2[0].

In a more general expression, a parity packet generated in the N-th order (the first parity packet is the 0-th order) by the terminal 2b is expressed as P2[N], and the coding vector of P2[N] is expressed as V2[N]. Similarly to the case of the terminal 2a, the coding vector V2 [N] is a vector value that may have one or a plurality of elements. Each element of V2[N] is the identification information of the source parity packet, and each element is expressed as V2[N]={v2[N, 0], v2[N, 1], . . . v2[N, d2[N]−1]}. Here, d2[N] is the number of source information packets used for generation of the N-th parity packet P2[N]. A set of information packets (information packets which have been received correctly from the base station 1 or have been recovered) that are not lost in the terminal 2b can be expressed as S2: that is, S2={R2[x]|R2[x] is not lost}.

In short, the N-th parity packet P2[N] of the terminal 2b can be generally expressed as follows.

$$S2=\{R2[x]|R2[x] \text{ is not lost}\}$$

$$V2[N]=\{v2[N,0],v2[N,1],\ldots,v2[N,d2[N]-1]\}$$

$$P2[N]=R2[v2[N,0]]+R2[v2[N,1]]++R2[v2[N,d2[N]-1]]$$

Here, the symbol "+" in the expression of P2[N] means an operation of the exclusive logical sum of respective bits in the packet.

The example of the terminal 2b in FIG. 4 can be expressed as follows.

$$S2=\{R2[0],R2[1],R2[2],R2[3],R2[4],R2[6],R2[7]\}$$

$$P2[0]=R2[0]+R2[2]+R2[4]+R2[7]$$

$$V2[0]=\{v2[0,0],v2[0,1],v2[0,2],v2[0,3]\}=\{0,2,4,7\}$$

$$d2[0]=4$$

A method of generating the parity packet and the coding vector will be described in a more general manner.

An information packet of identification information x received by a certain terminal 2 is expressed as R[x] and a set of non-lost information packets of the terminal 2 is expressed as S={R[x]|R[x] is not lost}. In a case where a parity packet generated in the N-th order (the parity packet generated first is the 0-th order) in the terminal 2 is expressed as P[N], a coding vector corresponding to P[N] is expressed as V[N], the number of elements of V [N] is expressed as d[N], and each element of V[N] is V[N]={v[N, 0], v[N, 1], V[N, d[N]−1]}, the parity packet P[N] and the coding vector V[N] are generated as follows.

(i) Determination of d[N]

d[N] is a predetermined positive integer and is equal to or smaller than the number of elements of S.

For example, d[N] is 4 or 8. In a case where these values exceed the number of elements of S, the number of elements of S is d[N]. Moreover, since the probability of recovery based on the generated parity packet varies depending on the value of d[N], the d[N] may be determined dynamically according to a packet loss rate or the like when receiving information packets transmitted from the base station 1.

(ii) Generation of V[N] (Selection of Source Information Packet)

d[N] packets are selected randomly and non-redundantly from the set S of information packets that are not lost in the terminal 2. The respective items of identification information of the selected d[N] packets are used as the values of the respective elements of V[N] and are expressed as v[N, 0], v[N, 1], . . . , v[N, d[N]−1].

(iii) Generation of P[N] (Generation of Parity Packet)

The exclusive logical sum of respective bits of the d[N] information packets of which the identification information is the values of the respective elements of V[N] is generated and the result is expressed as P[N].

$$P[N]=\Sigma\{R[x]|x \text{ includes } V[N]\}=R[v[N,0]]+R[v[N,1]]+\ldots+R[v[N,d[N]-1]]$$

The addition symbol "+" in the expression means an operation of the exclusive logical sum of the respective bits.

Σ means an operation of the exclusive logical sum of the respective bits of the respective elements (packets).

Figure 5:
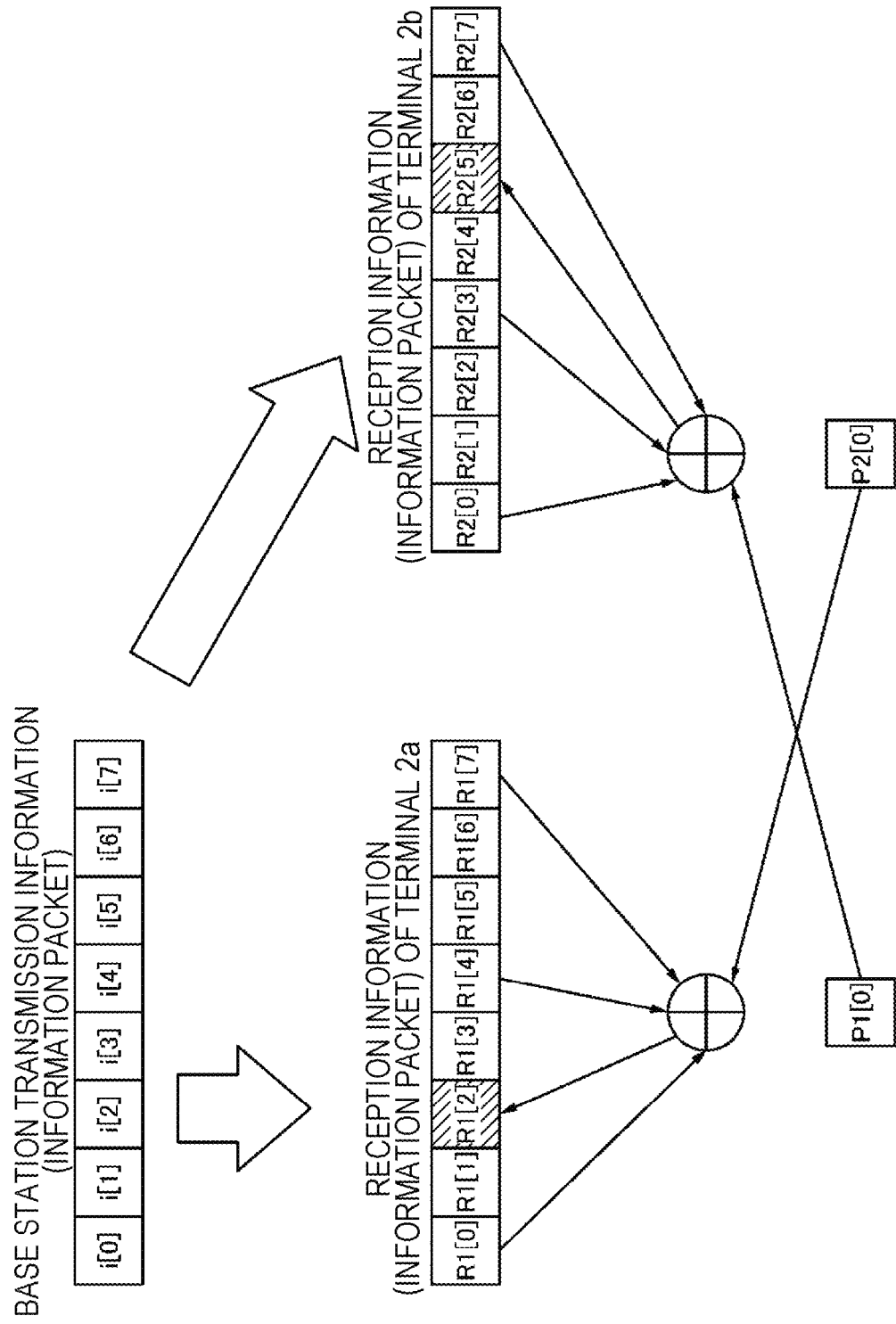
FIG. 5 is a schematic diagram for describing an operation of the present disclosure.

FIG. 5 is a diagram for describing multicasting of generated parity packets and recovery of a lost packet, and the following operations are performed.

(3) Multicasting of Parity Packets (i) The terminal 2a multicasts the parity packet P1[0] and the coding vector V1[0] to the local network 3.

(ii) Similarly, the terminal 2b multicasts the parity packet P2[0] and the coding vector V2[0] to the local network 3. When the parity packet and the coding vector are multicast to the local network 3, the parity packet and the coding vector are connected and are transmitted on the local network 3 as a single packet.

(4) Reception and Storage of Parity Packet (i) The terminal 2b receives the parity packet P1[0] and an associated coding vector V1 [0] transmitted on the local network 3 and stores the same in the parity packet storage unit 16.

(ii) The terminal 2a receives the parity packet P2[0] and an associated coding vector V2 [0] transmitted on the local network 3 and stores the same in the parity packet storage unit 16.

(5) Information Packet Recovery Process (i) In the terminal 2a, the parity sharing error control unit 17 can recover the lost information packet R1[2] from the parity packet P2[0] and the associated coding vector V2[0]= {0, 2, 4, 7} in the following manner. Note that the symbol "+" means an operation of calculating an exclusive logical sum of respective bits of the packet.

From the coding vector V2 [0]={0, 2, 4, 7}, it is understood that P2[0]=R2 [0]+R2 [2]+R2 [4]+R2 [7]. Since the terminals 2a and 2b receives the same information packet from the base station, the information packets of the same identification information received by the respective terminals have the same value. That is, since R1[x]=R2[x] for the same identification information x, when R2 is replaced with R1, an expression P2[0]=R1[0]+R1 [2]+R1 [4]+R1 [7] is obtained.

Since R1[0], R1[4], R1[7], P2[0] are data which is not lost in the terminal 2a, when the equation is solved for R1[2], it is possible to recover the lost information packet R1[2].

$$R1[2]=R1[0]+R1[4]+R1[7]+P2[0]$$

(ii) In the terminal 2b, similarly, it is possible to recover R2[5] by the following computation from the parity packet P1 [0] and the associated coding vector V1[0]={0, 3, 5, 7}.

$$R2[5]=R2[0]+R2[3]+R2[7]+P1[0]$$

The information packet recovery process will be described in a more general manner.

The information packet recovery process is a process executed individually in respective terminals 2 and is executed whenever parity packets are received and stored. The information packet recovery process in a state where a certain terminal 2 has received N parity packets and a coding vector is described as follows.

(i) A "parity checking process" to be described below is executed for each of N parity packets and the corresponding coding vectors stored in the parity packet storage unit 16 of the terminal 2.

(ii) After the process (i) ends, it is determined whether the process (i) is to be executed again.

(ii-1) In a case where one or more information packets are recovered as a result of the process (i), the process (i) is executed again.

(ii-2) In a case where no information packet was recovered as the result of the process (i), the recovery process ends.

[Parity Checking Process]

A parity packet for which a parity checking process is performed is expressed as P[x], the corresponding coding vector is expressed as V[x], the number of elements of V[x] is expressed as d[x], an element of V[x] is expressed as V[x]={v[x, 0], v[x, 1], . . . , v[x, d[x]−1]}, an information packet of identification information y is expressed as R[y], and a set of information packets (information packets which are received corrected from the base station 1 or have been recovered) which are not lost in the terminal 2 is expressed as S={R[x]|R[x] is not lost}. The number of source information packets of P[x] (that is, the number of information packets of which the identification information is the values of the respective elements of V[x]) is d[x] and the source information packets can be expressed as R[v[x, 0]], R[v[x, 1]], . . . , R[v[x, d[x]−1]].

It is determined whether there is only one lost packet in the terminal 2 among these d[x] information packets. That is, it is determined whether the number of information packets that are not included in the set S among the d[x] information packets {R[v[x, 0]], R[v[x, 1]], R[v[x, d[x]−1]]} is 1.

In a case where only one information packet is lost among these d[x] information packets, the information packet is recovered. When the identification information of the only one lost information packet is z, R[z] is recovered as follows.

Recovery of R[z]

R[z]=P[x]+Σ{R[y]|y is included the elements of V[x] and y is not equal to z}

Here, the symbol "+" means an operation of an exclusive logical sum of the respective bits of the packet and Σ means an operation of the exclusive logical sum of the respective bits of the element packets.

The recovery expression R[z] means calculating an exclusive logical sum of respective bits of all information packets of which the identification information is not z and the parity packet P[x] among the set {R[v[x, 0]], R1[v[x, 1]], . . . , R1[v[x, d[x]−1]]} of information packets having the identification information included in V[x] to thereby recover the lost information packet R[x].

Moreover, by the definition of the set S, R[z] is included in the set S after the recovery process is performed.

By repeating the processes (2), (3), (4), and (5) and sharing a plurality of parity packets, it is possible to increase the possibility to recover a lost packet and to improve the reception quality.

While the operation of the two terminals 2a and 2b has been described, in a case where there are three or more terminals 2, the respective terminals 2 perform a similar operation. In a case where three or more terminals 2 are present on the local network 3, the parity packet is transmitted simultaneously to all terminals 2 connected to the local network 3 as well as the terminals 2a and 2b by multicasting and is received simultaneously by the respective receiving terminals 2, and the recovery process is performed.

According to an embodiment of the present disclosure, since a plurality of terminals shares the parity packet simultaneously by multicasting and a lost packet recovery process can be performed, the load on the local network is small. It is possible to share highly efficient reception data and recover a lost packet.

As described in (2), a source information packet of the parity packet is selected randomly, and information indicating an information packet which is lost in different terminals 2 is not necessary. Since it is not necessary to transmit the lost packets of the respective terminals 2 individually as in the conventional technique, the number of terminals 2 for the volume of the local network 3 is not limited.

Moreover, when the processes are repeated and the source packet is selected randomly in order to generate the parity packet more efficiently in the process (2), the selection probability is updated according to the number of times the source packet was selected.

For example, a relative selection probability $P(x, n)$, in a case where the number of times an information packet x was selected as a source packet is n, is updated as follows.

$P(x,n)=P(x,n-1)*0.05$ (for $n>0$)

$P(x,0)=1.0$ (for $n=0$)

Although all information packets are selected with the same probability when the first parity packet is generated, once the information packet x is selected for generation of a parity, a relative probability that the information packet x is selected when the next parity is generated is 1/20.

Figure 6:
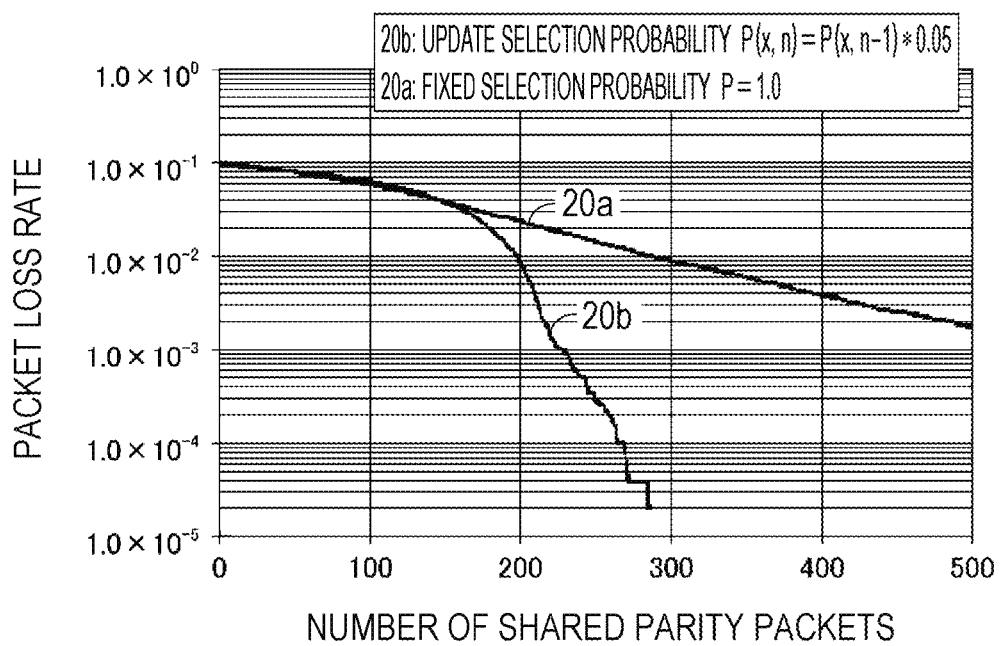
FIG. 6 is a graph for describing the effect of updating a selection probability of an information packet according to the present disclosure.

FIG. 6 illustrates the effect of updating the selection probability of an information packet. Line 20a illustrates a case where the selection probability is always constant and line 20b illustrates a case where the selection probability is updated according to the above-described equation. In a case where the selection probability is updated (see line 20b), a large number of packets are recovered using a small number of parity packets.

The processes may be performed using a terminal 2 in which some of the above-described functions of the terminal 2 are not provided as illustrated below.

(i) A terminal 2 that generates and transmits a parity only.

(ii) A terminal 2 that receives a parity and recovers an information packet only.

The terminal of (i) is a terminal having the functions (1), (2), and (3) among the functions described in the following description: The terminal 2 which is a radio communication device has the following functions.

(1) A function of receiving an information packet transmitted from the base station 1;

(2) A function of generating a parity packet and a coding vector from the information packet.

(3) A function of multicasting the generated parity packet and coding vector to the local network.

(4) A function of receiving parity packets and coding vectors multicast by other terminals via the local network and storing the parity packets and coding vectors.

(5) A function of recovering a lost information packet using the stored parity packets and coding vectors.

The terminal of (ii) is a terminal having the functions (1), (4), and (5) among the functions described in the following description: The terminal 2 which is a radio communication device has the following functions.

(1) A function of receiving an information packet transmitted from the base station 1;

(2) A function of generating a parity packet and a coding vector from the information packet.

(3) A function of multicasting the generated parity packet and coding vector to the local network.

(4) A function of receiving parity packets and coding vectors multicast by other terminals via the local network and storing the parity packets and coding vectors.

(5) A function of recovering a lost information packet using the stored parity packets and coding vectors.

An example of the terminal 2 having the functions of (i) is a stationary broadcast receiving device having an outdoor antenna such as the Yagi antenna. Since such a broadcast receiving device has a good broadcast reception performance and is less likely to miss an information packet during broadcast reception, it is not necessary to perform a lost packet recovery process. Therefore, the broadcast receiving device may function as the terminal 2 that generates and transmits a parity only as in (i).

Moreover, an example of the terminal 2 having the functions of (ii) is a portable apparatus such as a smartphone having a broadcast receiving function. In a case where such a terminal is used outdoors where broadcast reception conditions are poor, for example, since it is highly likely to lose an information packet during broadcast reception, the terminal may function as the terminal 2 that performs a parity reception and recovery function only as in (ii).

The parity packet may be generated using general error correction coding (ECC) as well as the method of the present embodiment. For example, the parity packet maybe generated using an error correction code (ECC) such as a Reed-Solomon code, a BCH code, or an LDPC code. In this case, the recovery process is performed by error correction decoding corresponding to the encoding of the parity packet.

3. Second Embodiment

A second embodiment of the present disclosure will be described. The concept of terminals used in the description will be described.

A Tanner graph is a graph generally used when illustrating a configuration of an error correction code (ECC) such as LDPC. The Tanner graph includes a variable node and a check node.

A variable node corresponds to an information packet or a parity packet in the present disclosure.

A check node indicates a parity check relation between variable nodes on the Tanner graph. A parity check relation means the relation between variable nodes connected to a check node and is a relation that an exclusive logical sum of these variable nodes is zero. A lost packet is recovered by evaluating a parity check relation in each check node. In the present disclosure, the check node is added whenever a coding vector associated with a parity packet is received.

A coding vector is information associated with a parity packet. In the present disclosure, the coding vector is used for allowing a parity packet generation terminal to notify other terminals of a parity check relation. The coding vector stores information (=parity check relation) on a source packet of the parity packet and includes the identification information of one or a plurality of source packets as elements. In the present disclosure, each terminal adds a check node and connects variable nodes according to the received coding vector.

A difference between the first and second embodiments will be described.

(i) In the first embodiment, when a parity packet is generated, the information packets received from the base station only are used. In the second embodiment, a parity packet which has been shared on the local network as well as the information packets received from the base station is used.

(ii) In the first embodiment, a single coding vector is not transmitted on the local network. However, in the second embodiment, a function of transmitting a single coding vector on the local network so that the coding vector is shared between terminals is also provided.

The functions of (i) and (ii) and the effects thereof will be described.

The functions (i) and (ii) contribute to improving the parity packet-based recovery function. In the present disclosure, the parity packet is multicast on the local network and is shared by respective terminals.

However, when packets are multicast on a local network, a packet loss (that is, a loss of a parity packet) may occur. In this case, as in (i), since the parity packet itself has a correlation with other parity packets (the parity packet is in a parity check relation with other parity packets), even in a case where the parity packet is lost when the parity packet is transmitted on the local network, there is a possibility that the parity packet can be recovered using other parity packets which was received correctly. Moreover, as in (ii), since the coding vector only is transmitted, the information packet can be recovered using a parity packet which could be recovered by the function of (i) (using the parity packet recovered using other parity packets although the parity packet was lost during transmission on the local network). The details of these functions (i) and (ii) are described in the following description in connection with FIG. 28: In step ST63, it is determined whether the same check node is present. This process ends in a case where the same check node is present (step ST64).

In step ST65, in a case where it is determined in step ST63 that the same check node is not present, a process of acquiring a vacant area of the check node storage unit is performed.

The parity packet connection process (step ST66), the information packet connection process (step ST67), and the check node queue adding process (step ST68) subsequent to the check node storage unit vacant area acquisition process (step ST65) are the same as the processes of the parity packet input unit 31 described with reference to the flowcharts of FIGS. 20, 21, and 22.

The effects of the present disclosure will be described with reference to the Tanner graphs of FIGS. 29 to 35.

As an example, symbols illustrated in the Tanner graph of FIG. 29 will be described. In the present disclosure, a check node is provided between an information packet and a parity packet. Parity packets P[1], P[2], P[3], and P[4] and information packets I[1], I[2], I[3], and I[4] are connected via check nodes C[1], C[2], C[3], and C[4]. The parity packets are generated and transmitted in the order of P[1], P[2], P[3], and P[4]. Moreover, in the encoding processing unit 32, the parity packet and the associated coding vector are combined as a parity packet transmission format and are transmitted on the local network.

Figure 7:
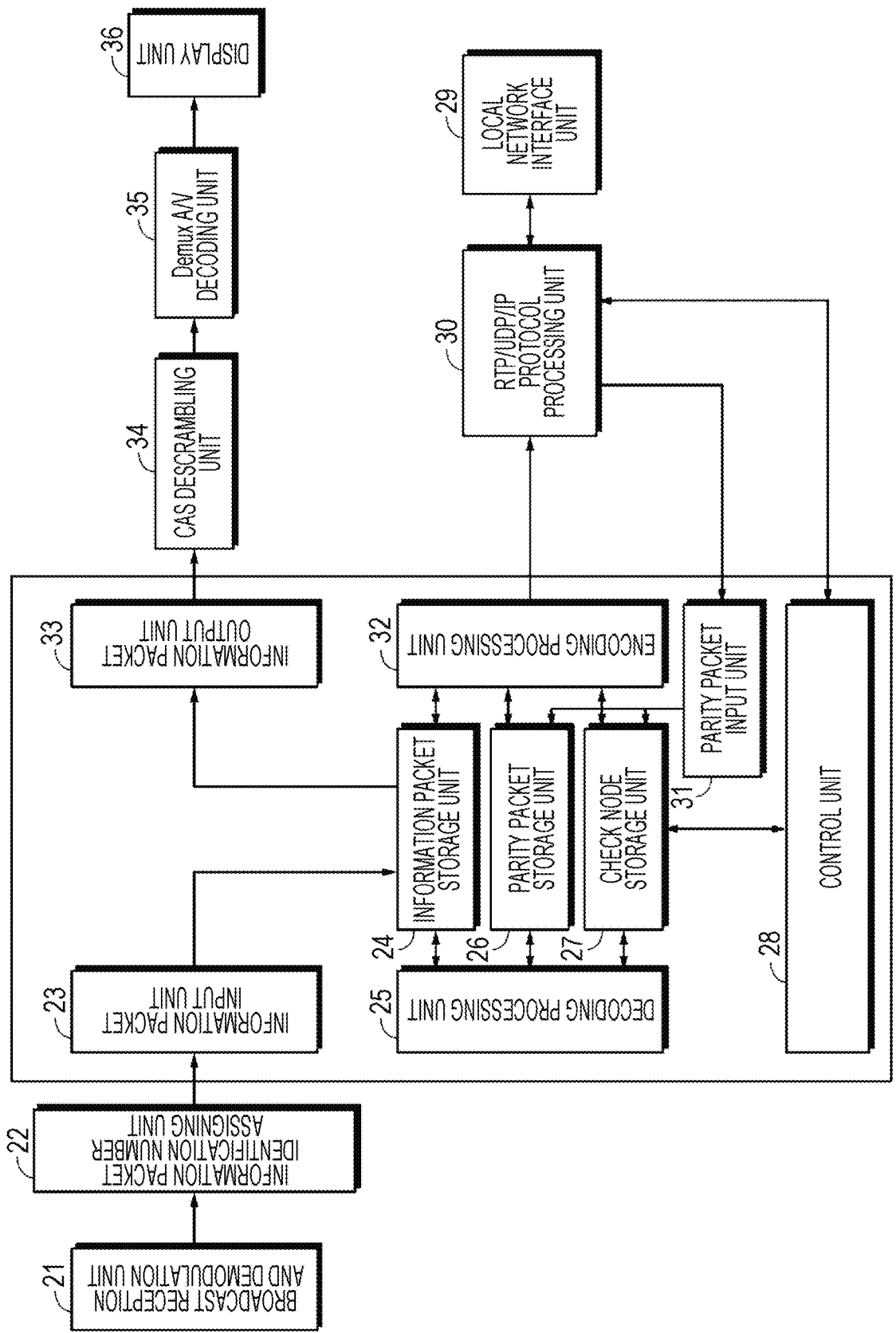
FIG. 7 is a block diagram illustrating a configuration of a terminal according to a second embodiment of the present disclosure.

FIG. 7 illustrates a configuration of a terminal according to the second embodiment. A broadcast reception and demodulation unit 21 has an antenna function, an RF tuner function, and a demodulation function. An MPEG2-TS packet is output from the broadcast reception and demodulation unit 21. In the present embodiment, it is assumed that even in a case where the reception state worsens due to fading or the like, the same number of TS packets as the number of packets transmitted by a broadcast transmitting device is output at fixed intervals accelerator opening sensor error packets or the like.

The TS packets output from the broadcast reception and demodulation unit 21 are supplied to an information packet identification information assigning unit 22. The information packet identification information assigning unit 22 assigns identification information to the MPEG2-TS packet output from the broadcast reception and demodulation unit 21.

During multicasting, the identification information of all source packets of the parity packet is appended. The following methods can be used as a method of generating the identification information.

(1) The identification information of the source information packet is generated from a PCR value of an MPEG2-TS packet.

(2) The identification information of the source information packet is generated from a continuity counter of the MPEG2-TS packet header.

(3) The identification information of the source information packet is generated by combining PCR values of a plurality of programs multiplexed in the MPEG2-TS packet and continuity counters of a plurality of PIDs.

(4) The identification information of the source parity packet is generated from unique information of a parity packet generation terminal and the number of parity packets having been generated already by the terminal.

An IP address or an MAC address of the local network is used as the unique information of the parity packet generation terminal.

Furthermore, generation source information of the transmitted parity packets is multicast on the local network.

Although a plurality of programs (PIDs) is generally multiplexed in an MPEG2-TS, the identification information is assigned to a PID which requires error control by sharing a parity.

The identification information is a number common to other terminals that share the parity packet.

The identification information is a value that can be uniquely determined by a broadcast reception signal.

As an example, the identification information is generated using the continuity counter values of a plurality of PID packets multiplexed in the same MPEG2-TS and a PCR value.

In digital broadcasting, multiplexing pursuant to the TS defined in MPEG2 (ISO/IEC 13818-1) is performed to form an MPEG2-TS.

Figure 8:
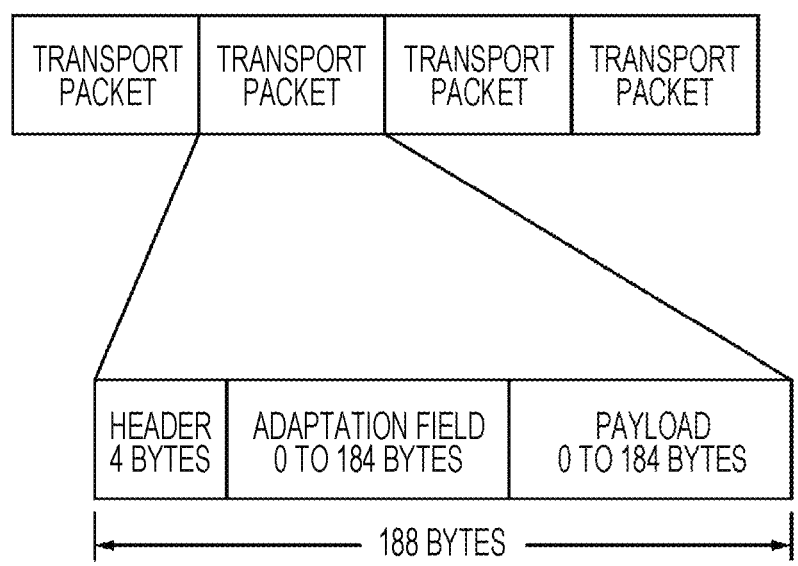
FIG. 8 is a schematic diagram for describing a transport stream.

FIG. 8 illustrates an outline of MPEG2-TS. MPEG2-TS uses a packet having a fixed-length (188 bytes). A 4-byte header area is defined at the start of each packet, and an adaptation field which is a variable-length extension header and a payload for transmitting contents (video, audio, or additional data) are arranged in the remaining 184-byte area.

A 13-bit PID (packet ID) is included in the header. The PID is an address for identifying the type of a packet. In the PID, a value is set to each video or audio stream, and the same PID is set to the same stream. For example, as for the NHK integrated broadcasting, a video PID is 256 and the audio PID is 272.

The 4-bit continuity counter in the header is a successive number appended to the same PID packet and is incremented by 1 as a modulo of 16 (that is, the counter has values of 0 to 15). The adaptation field has a variable length in byte units. An extension function of a header includes a function of transmitting a program clock reference (PCR) for synchronization. The PCR is not transmitted always but is transmitted generally at a cycle of 100 ms as a value in the adaptation field. The cycle of the counter value circulates in one day and the resolution of the value is 90 kHz.

Figure 9:
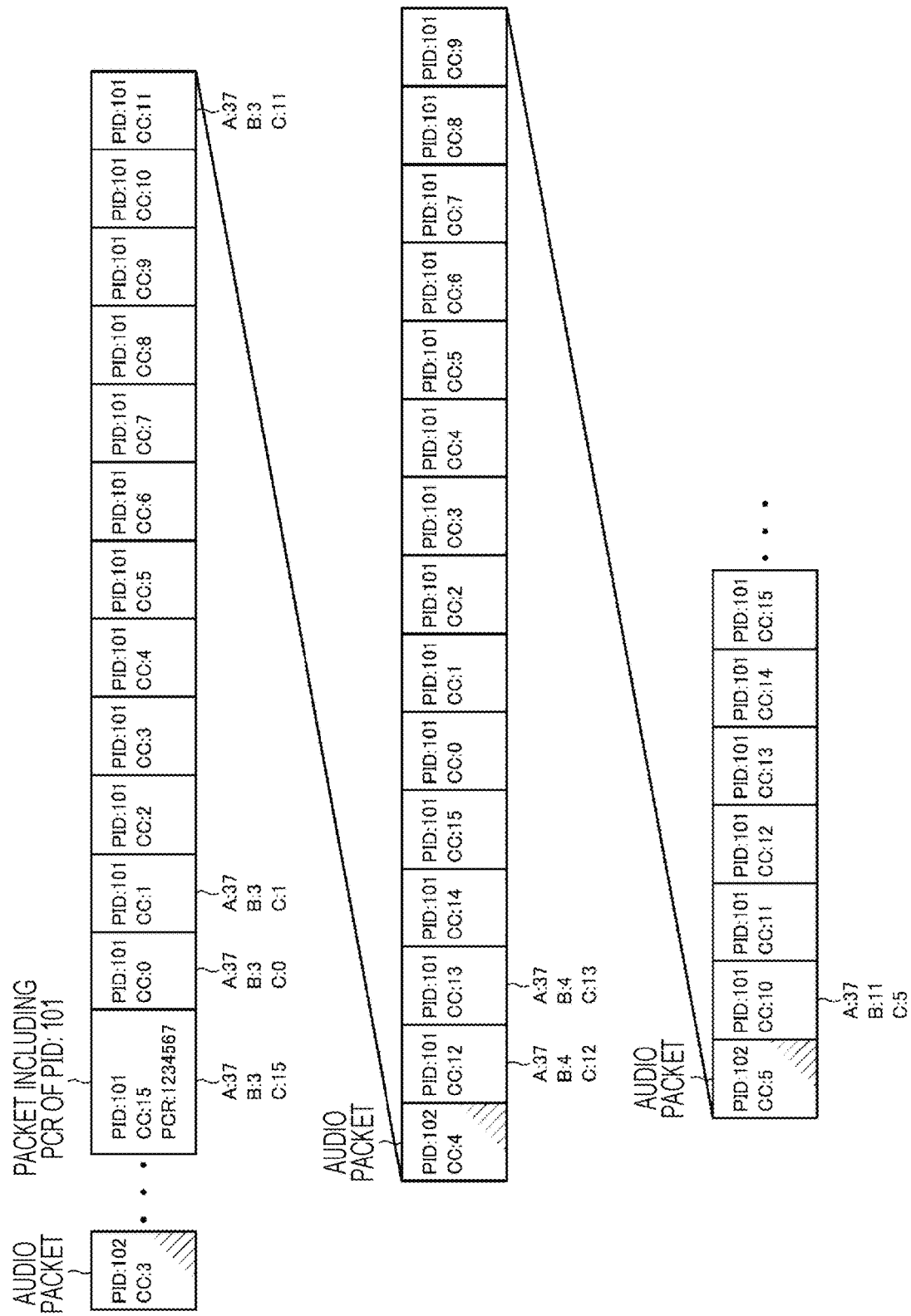
FIG. 9 is a schematic diagram for describing an example of a method of appending identification information.

A plurality of video or audio streams is multiplexed in one MPEG2-TS using different PIDs. FIG. 9 illustrates an example in which an audio (having a lower information rate than a video) is multiplexed and transmitted together with a video. In FIG. 9, each rectangular block indicates one TS packet and a hatched TS packet is an audio packet. A video packet is set to (PID: 101) and an audio packet is set to (PID: 102). The value of the continuity counter circulates between 0 and 15 for each PID. The value indicated by PCR indicates a PCR-based value.

The identification information of the source packet is generated by combining a plurality of multiplexed push-pull PCR values and the continuity counters of a plurality of PIDs. For example, identification information (A,B,C) made up of three numbers is generated for a video packet (PID: 101) and is used as the identification information of each packet.

A PCR value and a continuity counter value are combined to generate identification information (A,B,C) made up of three numbers and the identification information is used as the identification information of each TS packet.

$A=([\text{Latest PCR value}]/[\text{PCR cycle}]) \bmod x$ $B=[\text{Latest continuity counter value of PID } \mathbf{102}]$ $C=[\text{Continuity counter value of packet of PID } \mathbf{101}]$ x is a parameter that determines the cycle of identification information.

x is set such that the cycle of the identification information is larger than an information packet buffer size (Nimax).

In a case where the PCR cycle is 9000 and X is 50, since the latest PCR value of the first video packet is (1234567), identification information of this packet is determined as follows.

A: 37
B: 3
C: 15

Identification information=(A, B, C)=(37, 3, 15)

The identification information of the next video packet is (A, B, C)=(37, 3, 0) similarly, and the identification information of the subsequent video packet is (A, B, C)=(37, 3, 1). After that, the identification information is assigned in a similar manner. After that, the identification information is assigned to respective video packets in a similar manner.

Note that, in the example of FIG. 9, a transmission cycle of an audio packet (PID=102) is within 16 video packets (PID=101). The transmission cycle of the PCR is within 16 audio packets (PID=102).

FIG. 8 is a diagram for describing a method of generating identification information of an information packet (an MPEG2-TS packet). In the drawing, a video (PID=101) and an audio (PID=102) are multiplexed in MPEG2-TS. FIG. 8 is a diagram for describing a method of generating identification information for a video packet (PID=101).

In this way, it is possible to obtain identification information having a long cycle by combining the continuity counters of a plurality of PIDs and a PCR value.

By generating the identification information in this manner, it is possible to assign identification information common to terminals sharing a parity packet to the information packet.

In this example, although the identification information is generated by combining the continuity counter values of two PIDs and one PCR value, the continuity counter values of a larger number of PIDs and the PCR value may be combined. Moreover, in this example, although the identification information is expressed as a combination of three numbers, the identification information may be expressed as one number.

For example, since the range of the values A and B is an integer of 0 to 15, the identification information may be expressed as one number as follows.

$\text{Identification information}=A+B*16^1+C*16^2$

As can be understood from this expression, it is possible to understand the order of information packets by comparing the magnitudes of the values of identification information.

The information packet to which the identification information is assigned is output to an information packet input unit 23. The information packet input unit 23 stores the TS packet to which the identification information is assigned in an information packet storage unit 24.

A vacant area in which the information packet is not stored is retrieved from the information packet storage unit 24. When a vacant area of the information packet storage unit 24 is InfoBuf[X], packets are stored as follows.

InfoBuf[X].data stores 188-byte data of the TS packet.

InfoBuf[X].info_id stores the identification information.

InfoBuf[X].loss is information indicating loss or errors and stores "0" for an information packet which could be received correctly. In a case where an error flag in a TS packet header is set, loss=1.

InfoBuf[X].sel_prob is an area that stores a probability (relative probability) to be selected when a parity packet is generated. In a case where a new information packet is stored, the probability is 1.0.

Figure 10:
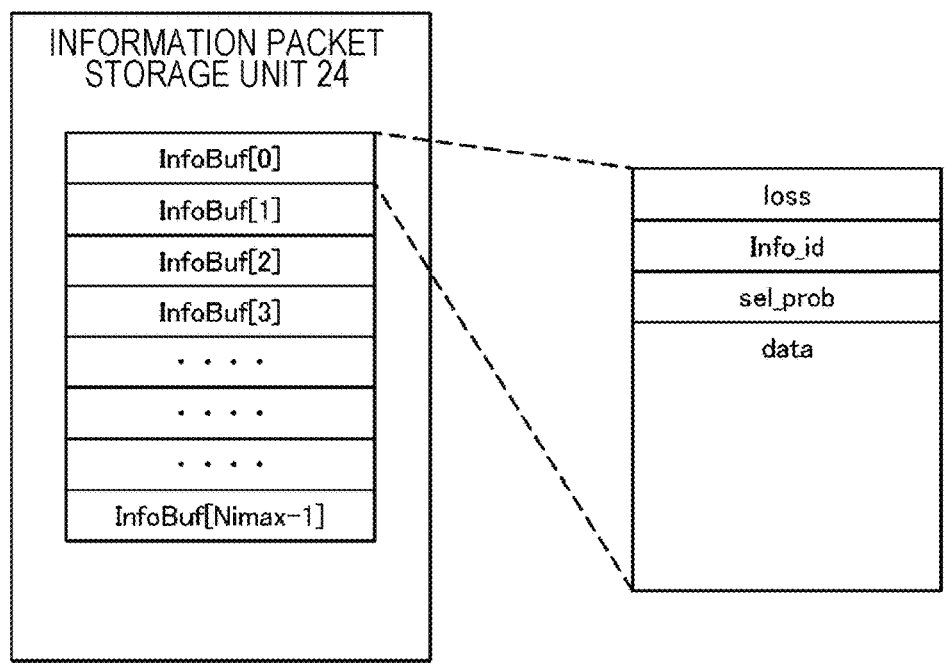
FIG. 10 is a schematic diagram for describing a storage area of an information packet storage unit.

FIG. 10 illustrates a configuration of the information packet storage unit 24. InfoBuf[0] to InfoBuf[Nimax−1] are storage areas for storing an information packet (MPEG2-TS packet) and information packet identification information. These areas can store up to Nimax packets.

Respective elements of the information packet storage unit 24 will be described.

loss is a flag indicating an error or a lost packet.

info_id is an area for storing information packet identification information.

sel_prob is an area for storing the probability (relative probability) to be selected when a parity packet is generated. This value is a relative value between information packets. An initial value is 0.

data is an area for storing MPEG2-TS packet data (188 bytes).

The relative selection probability sel_prob will be described. An information packet having a relatively high sel_prob value is selected as a source packet of a parity packet with a high probability, whereas an information packet having a low sel_prob value is selected as a source packet of a parity packet with a low probability. By decreasing this value according to the number of selections, it is possible to lower the probability of the same information packet to be selected redundantly and to generate a highly efficient parity packet. The sel_prob value is updated by the encoding processing unit 32.

Figure 11:
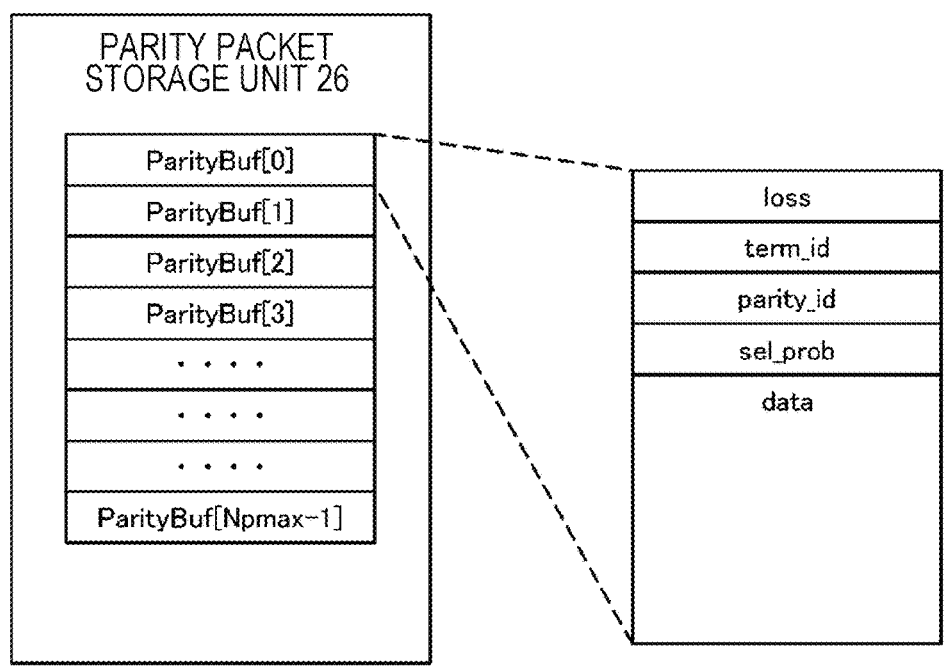
FIG. 11 is a schematic diagram for describing a storage area of a parity packet storage unit.

FIG. 11 illustrates a configuration of the parity packet storage unit 26. Hereinafter, Npmax is defined as the number of parity packets that can be stored in the parity packet storage unit. ParityBuf[0] to ParityBuf[Npmax−1] are storage areas for storing parity packets.

Respective elements of the parity packet storage unit 26 will be described.

loss is a flag indicating that a parity packet is an error or is lost.

term_id is transmitting terminal identification information unique between terminals sharing a parity.

parity_id is parity packet identification information (unique within terminals having generated a parity)

sel_prob stores the probability to be selected as a generation source of a parity packet in the encoding processing unit. The relative selection probability is a relative value between respective packets.

Figure 12:
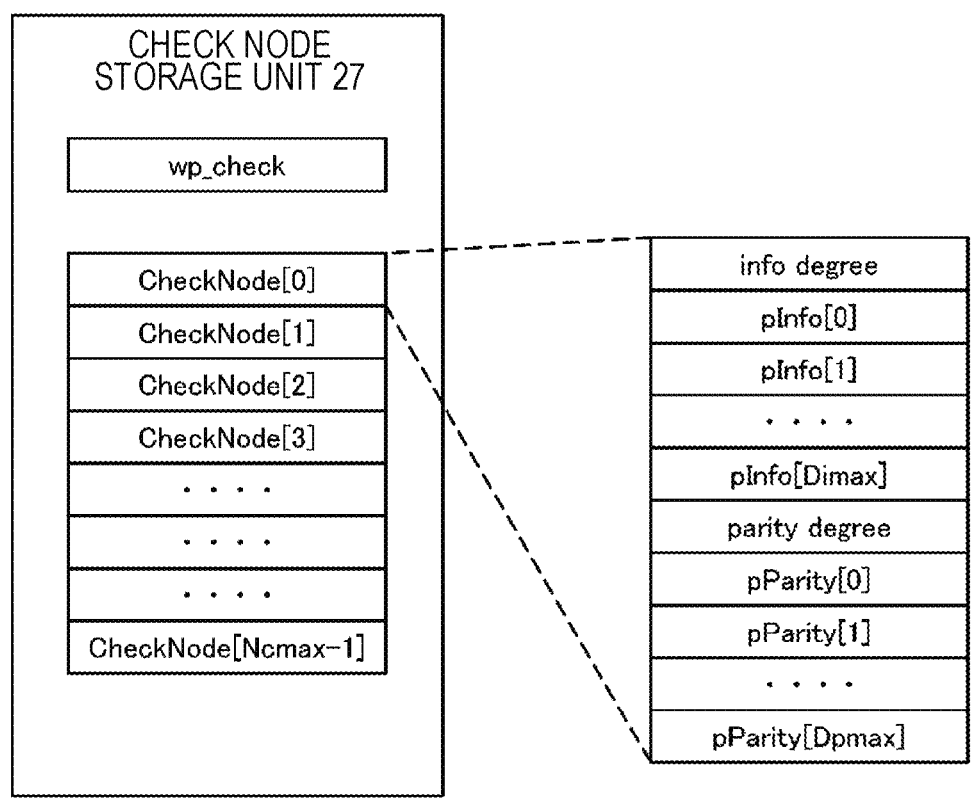
FIG. 12 is a schematic diagram for describing a storage area of a check node storage unit.

FIG. 12 illustrates a configuration of the check node storage unit 27. The check node is an area for storing a parity check relation between an information packet and a parity packet.

Respective elements of the check node storage unit will be described.

info_degree stores the number of information packets connected to the check node.

pInfo[ ] indicates the location (the address of a storage area) of a data storage area (any one of InfoBuf[0] to InfoBuf[Nimax−1]) of the information packet connected to the check node.

parity_degree stores the number of parity packets connected to the check node.

pParity[ ] indicates the location (the address of a storage area) of a storage area (any one of ParityBuf[0] to ParityBuf[Npmax−1]) of the parity packet connected to the check node.

Figure 13:
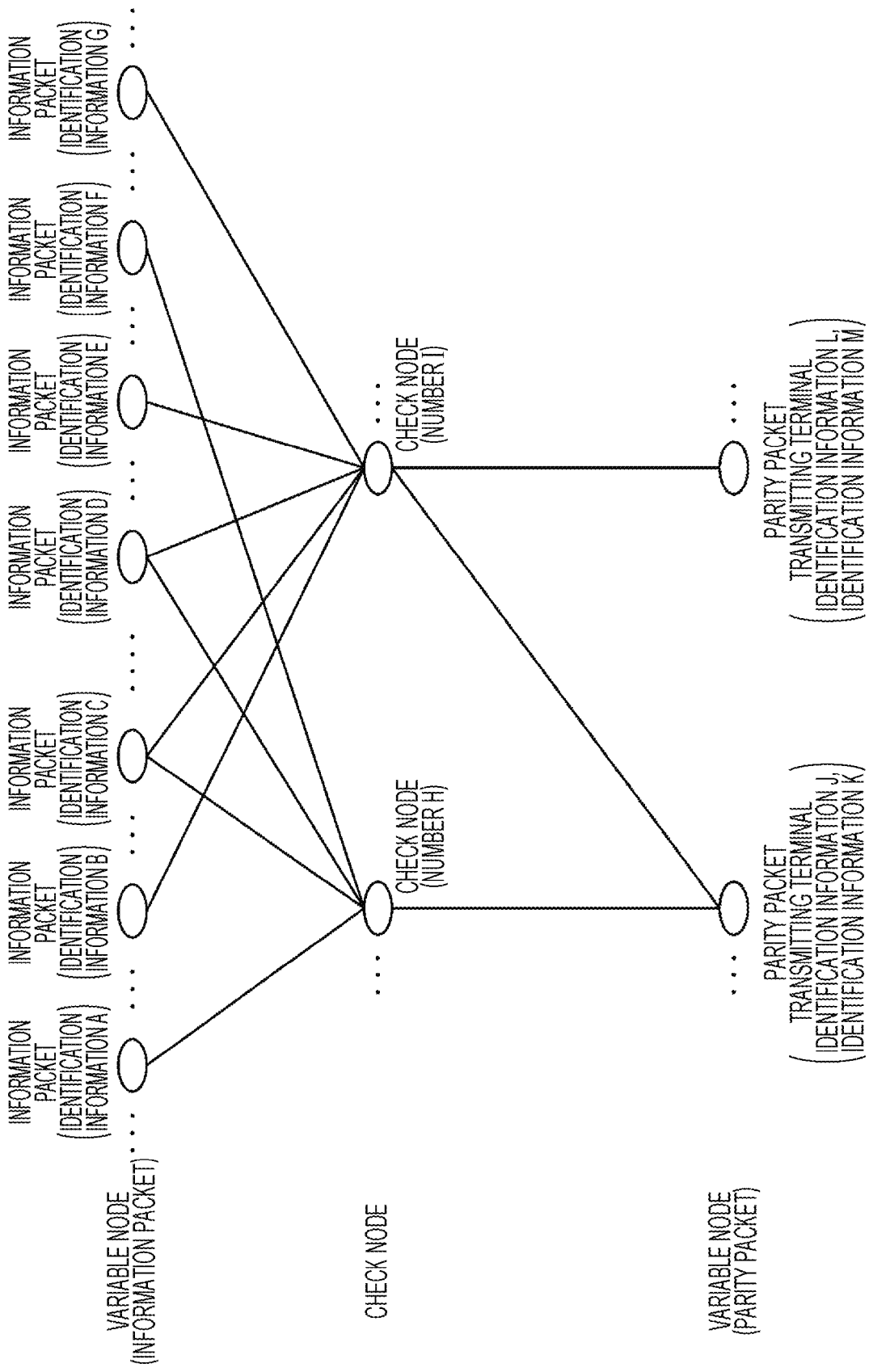
FIG. 13 is a schematic diagram for describing a Tanner graph.
Figure 14:
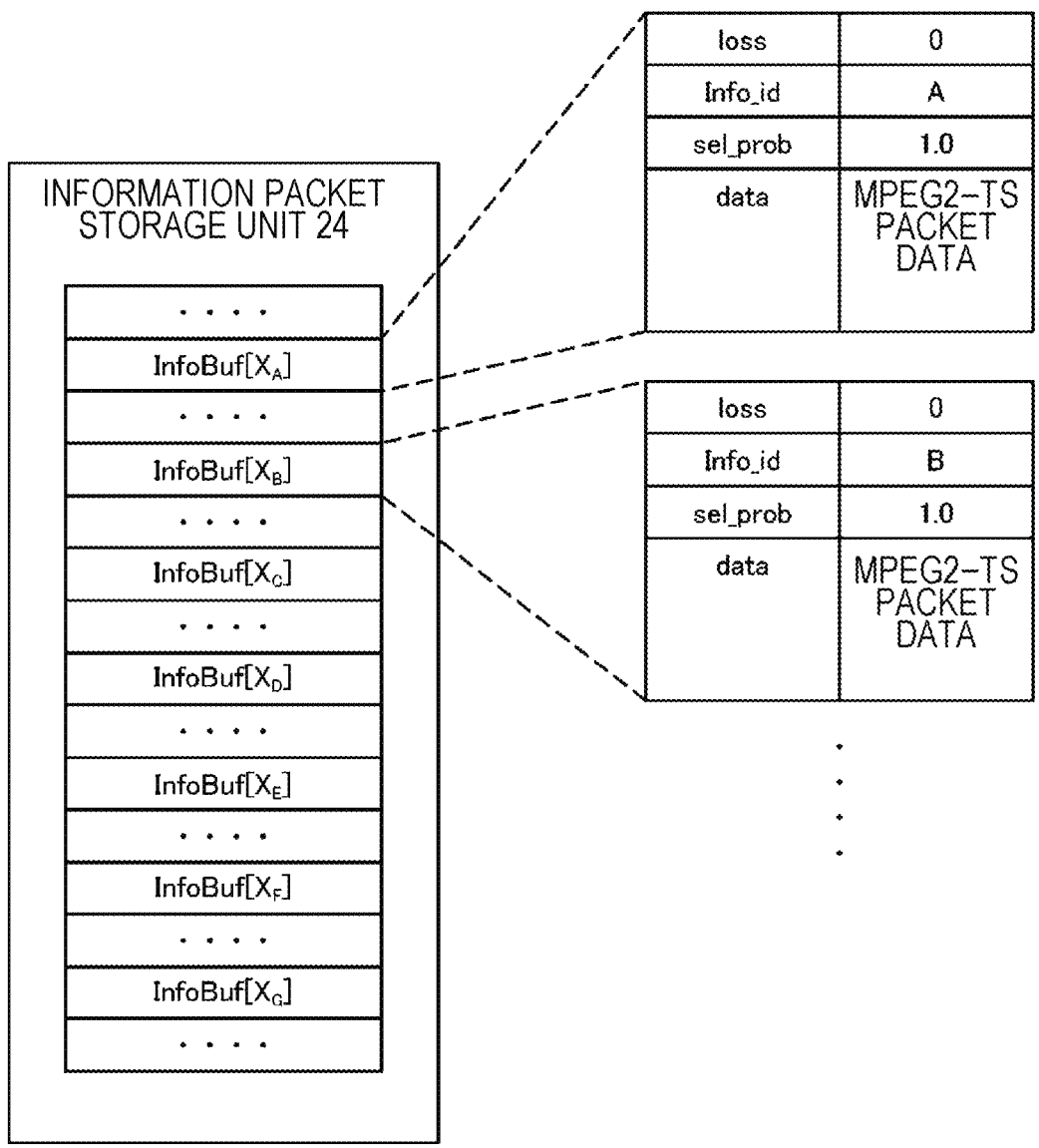
FIG. 14 is a schematic diagram for describing an information packet storage unit corresponding to the Tanner graph.
Figure 15:
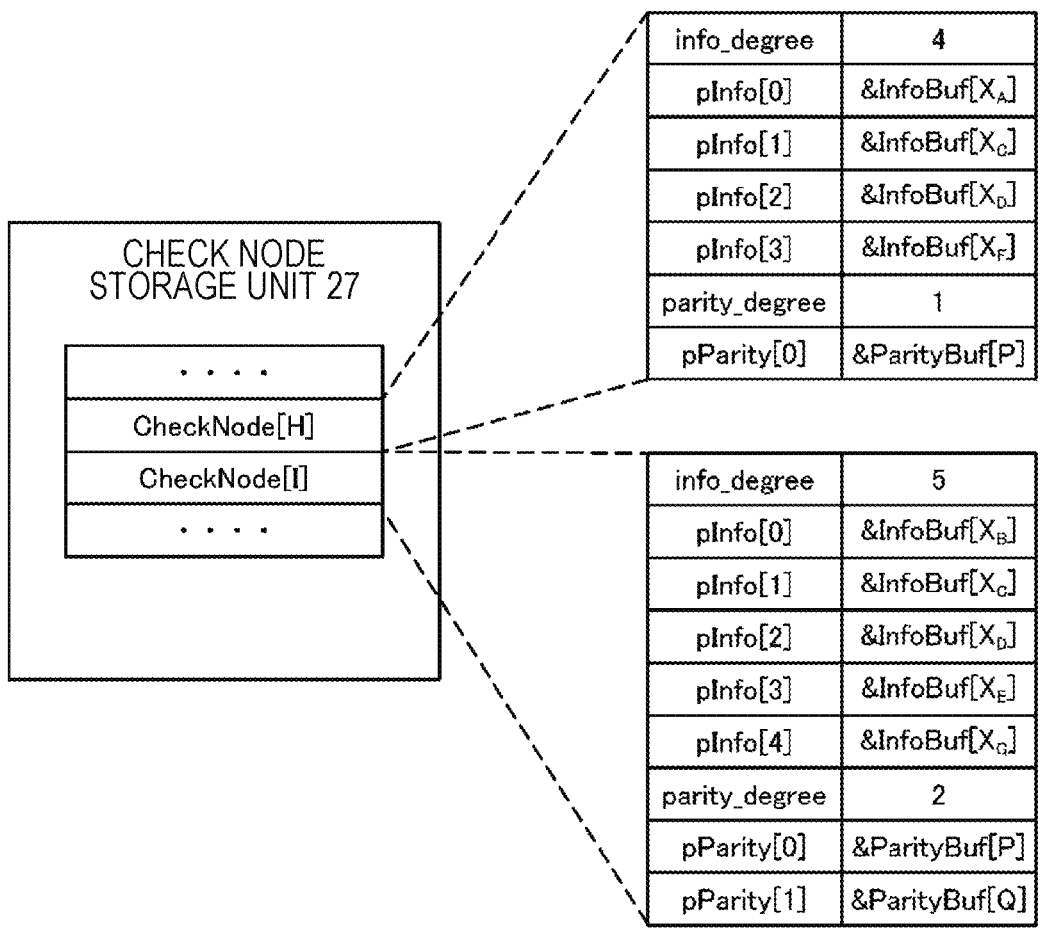
FIG. 15 is a schematic diagram for describing a check node storage unit corresponding to the Tanner graph.
Figure 16:
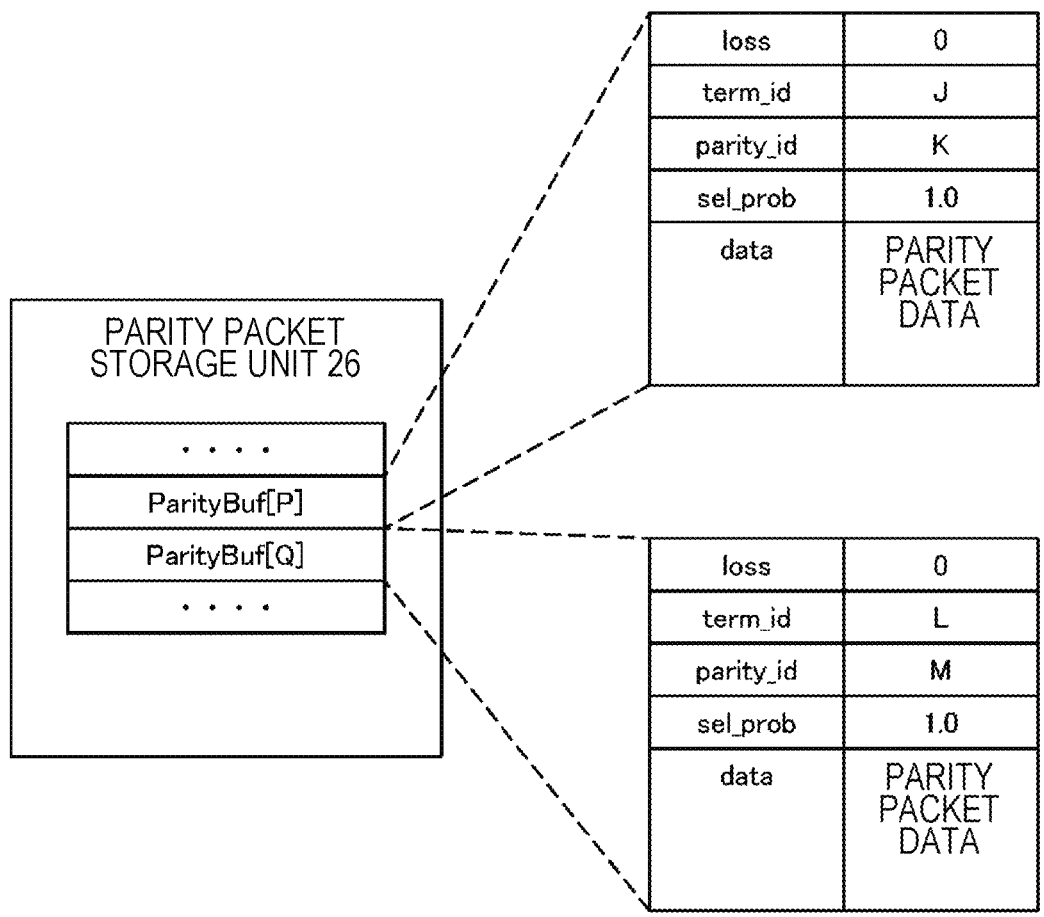
FIG. 16 is a schematic diagram for describing a parity packet storage unit corresponding to the Tanner graph.

The relation among the information packet storage unit 24, the parity packet storage unit 26, and the check node storage unit 27 will be described. FIG. 13 illustrates a Tanner graph and FIGS. 14, 15, and 16 are diagrams for describing a specific example of the correlation of three storage units in the state of the Tanner graph illustrated in FIG. 13.

The information packet storage unit 24 and the parity packet storage unit 26 correspond to variable nodes (sometimes referred to as variable nodes, message nodes, or the like) in the Tanner graph and the check node storage unit 27 corresponds to a check node. In this example, seven information packets {A, B, C, D, E, F, G} illustrated in FIG. 14 and two parity packets {(J, K), (L, M)} illustrated in FIG. 16 are connected via a check node {H, I} illustrated in FIG. 15.

FIG. 13 illustrates that the parity packet (J, K) is generated by the exclusive logical sum of the four information packets {A, C, D, F}. That is, the four information packets {A, C, D, F} are source packets (source information packets) of the parity packet (J, K).

Moreover, the parity packet (L, M) is generated by the exclusive logical sum of five information packets {B, C, D, E, G} and one parity packet (J, K). In other words, the five information packets {B, C, D, E, G} are source information packets of the parity packet (L, M), and one parity packet (J, K) is a source parity packet of the parity packet (L, M).

The function of the check node will be described. The check node is connected to an information packet and a parity packet and stores packets being in a parity check relation (a relation that an exclusive logical sum of all bits of the connected bits). A lost packet is recovered using this parity check relation. That is, in a case where only pone packet is lost among all packets connected to the check node, the lost packet can be recovered by calculating an exclusive logical sum of respective bits of packets other than the lost packet.

For example, in a case where the information packet G in FIG. 13 is lost and the other packets are not lost, the information packet G can be recovered by calculating an exclusive logical sum of respective bits of the information packets B, C, D, and E and the parity packet (J, K) (L, M) according to the parity check relation of the check node I.

In the present disclosure, the connection information of the check node is transmitted as a coding vector associated with the parity packet. By a parity packet reception process to be described later, a new check node is added whenever a parity packet is received, and a connection between the check node and the respective packets is added according to the coding vector received simultaneously with the parity packet.

Moreover, in a case where the coding vector only is transmitted, a connection between the check node and the respective packets is added when the coding vector is received as explained as follows. The control unit 28 instructs execution of the process of the encoding processing unit 32 in the parity packet generation cycle on the basis of the information packet input timing obtained from the parity packet input unit 31.

A coding vector information transmission process will be described.

Coding vector information is generated from the information on the check node corresponding to the parity packet generated by a subject terminal, stored in the check node storage unit 27, and is output to the RTP/UDP/IP protocol processing unit 30. This process is performed in a predetermined cycle.

The check node used for generation of the coding vector information is selected randomly by the check node storage unit 27.

Figure 27:
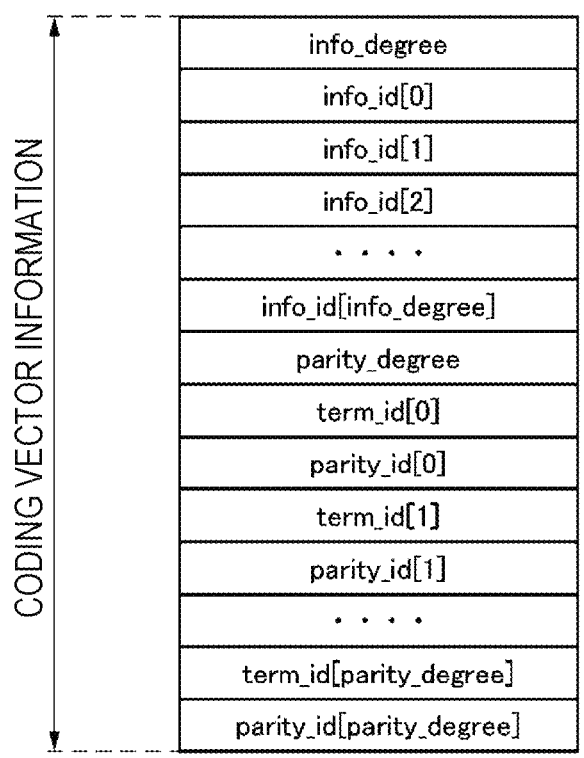
FIG. 27 is a schematic diagram for describing coding vector information.

FIG. 27 illustrates coding vector information. When the check node selected from the check node storage unit 27 is CheckNode[y], the elements of the coding vector is determined as follows.

info_degree: CheckNode[y].info_degree
info_id[0]: CheckNode[y].pInfo[0]->info_id
info_id[1]: CheckNode[y].pInfo[1]->info_id
. . . [Continued for info_degree]
parity_degree: CheckNode[y].parity_degree
term_id[0]: CheckNode[y].pParity[0]->term_id
parity_id[0]: CheckNode[y].Pparity[0]->parity_id
term_id[1]: CheckNode[y].pParity[1]->term_id
parity_id[1]: CheckNode[y].Pparity[1]->parity_id
. . . [Continued for parity_degree]

By transmitting the coding vector information, it is possible to allow other terminals to acquire the configuration information (the source packet information) of a parity packet which could not been received by other terminals due to reasons such as a packet loss on the local network although the parity packet was transmitted from the subject terminal and to generate the check node Transmission of the coding vector information enables the recovery function to be achieved for a packet loss on the local network.

The coding vector information receiving process will be described.

A check node is added to the check node storage unit 27 according to the coding vector information obtained from the RTP/UDP/IP protocol processing unit 30.

Figure 28:
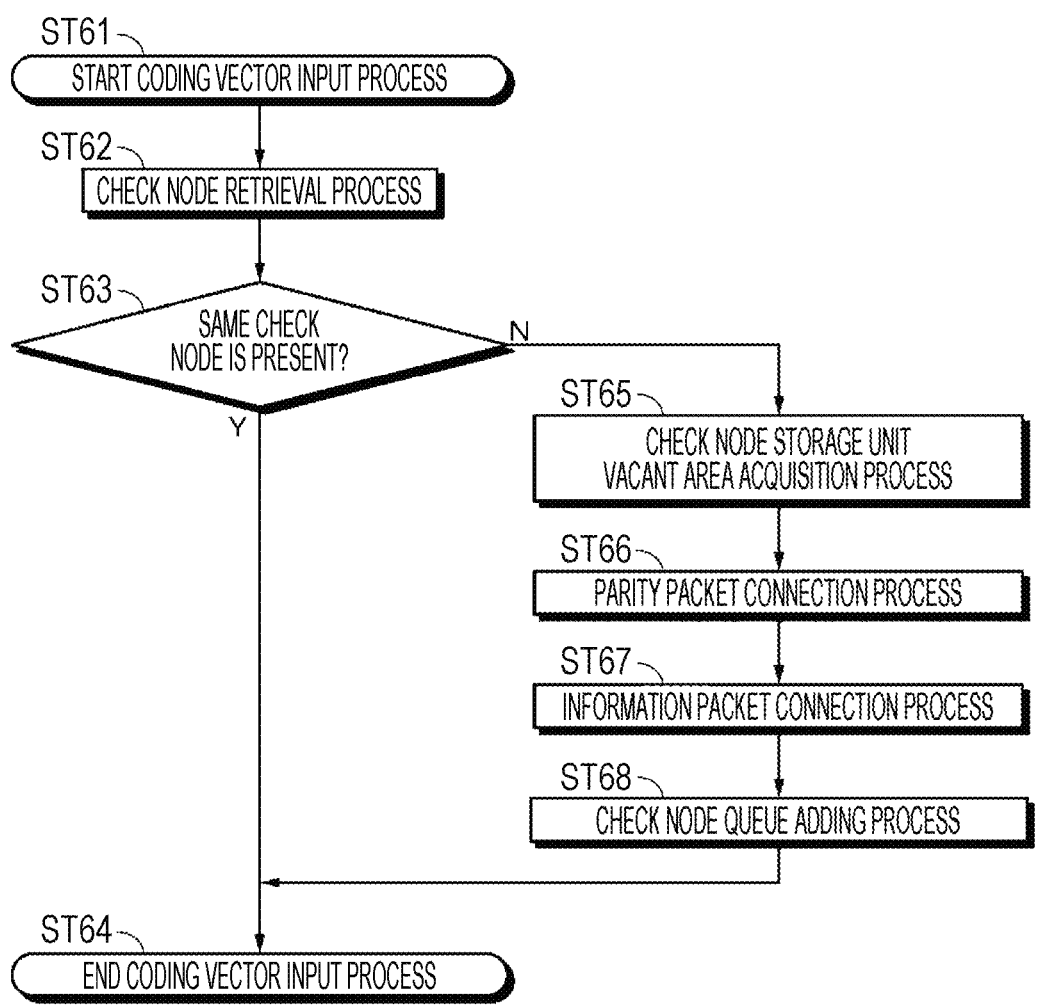
FIG. 28 is a flowchart for describing a coding vector information receiving process.

The flowchart of FIG. 28 illustrates the process when the coding vector is received. Hereinafter, the respective processes of the flowchart will be described.

In step ST61, a coding vector input process starts.

In step ST62, a check node retrieval process is performed.

The same check node (a check node in which the identification information of all packets connected thereto is identical to that of the received coding vector information) as the received coding vector information is retrieved within the check node storage unit 27.

In step ST63, it is determined whether the same check node is present. This process ends in a case where the same check node is present (step ST64).

In step ST65, in a case where it is determined in step ST63 that the same check node is not present, a process of acquiring a vacant area of the check node storage unit is performed.

The parity packet connection process (step ST66), the information packet connection process (step ST67), and the check node queue adding process (step ST68) subsequent to the check node storage unit vacant area acquisition process (step ST65) are the same as the processes of the parity packet input unit 31 described with reference to the flowcharts of FIGS. 20, 21, and 22.

The effects of the present disclosure will be described with reference to the Tanner graphs of FIGS. 29 to 35.

As an example, symbols illustrated in the Tanner graph of FIG. 29 will be described. In the present disclosure, a check node is provided between an information packet and a parity packet. Parity packets P[1], P[2], P[3], and P[4] and information packets I[1], I[2], I[3], and I[4] are connected via check nodes C[1], C[2], C[3], and C[4]. The parity packets are generated and transmitted in the order of P[1], P[2], P[3], and P[4]. Moreover, in the encoding processing unit 32, the parity packet and the associated coding vector are combined as a parity packet transmission format and are transmitted on the local network.

A set of identification numbers of the source information packets of the parity packet P[x] is expressed as Vi[x]={vi[x, 0], vi[x, 1], . . . , vi[x, di[x]−1]}. Here, di[x] is the number of source information packets of P[x]. A set of identification numbers of source parity packets of the parity packet P[x] is expressed as Vp[x]={vp[x, 0], vp[x, 1], . . . , vp[x, dp[1]−1]}. Here, dp[x] is the number of source parity packets of P[x].

Figure 29:
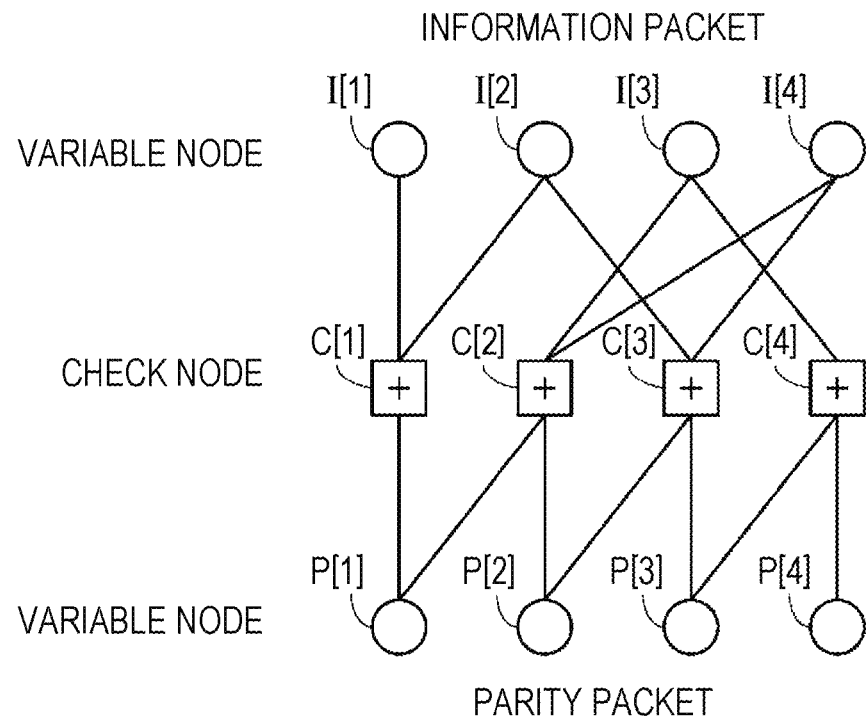
FIG. 29 is a Tanner graph for describing the present disclosure.

For example, since P[2] in FIG. 29 is generated from the information packets I[3] and I[4] and the parity packets P[1], the coding vectors Vi[2] and Vp[2] can be expressed as follows.

$$di[2]=2$$

$$Vi[2]=\{vi[2,0],vi[2,1]\}=\{3,4\}$$

$$dp[2]=1$$

$$Vp[2]=\{vp[2,0]\}=\{1\}$$

Figure 30:
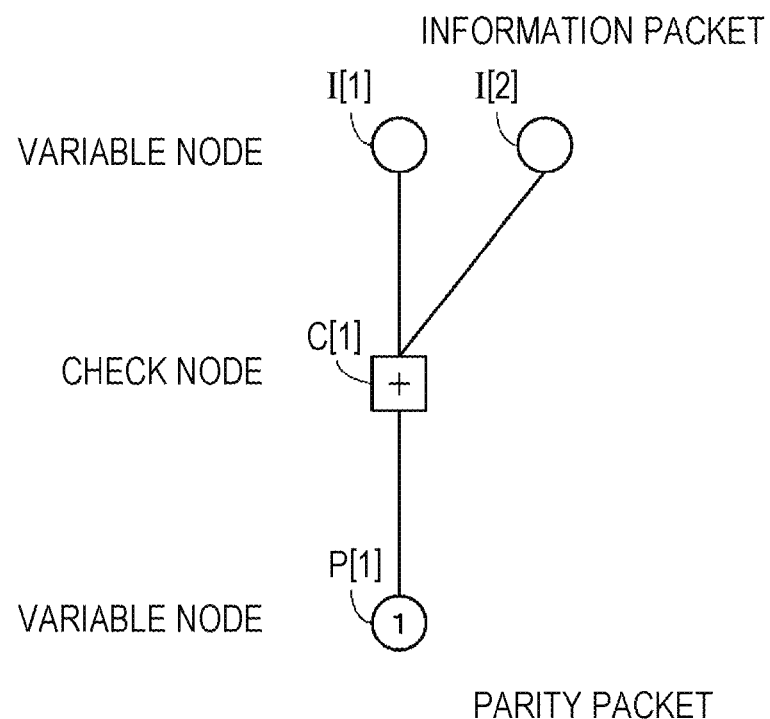
FIG. 30 is a Tanner graph for describing the present disclosure.
Figure 31:
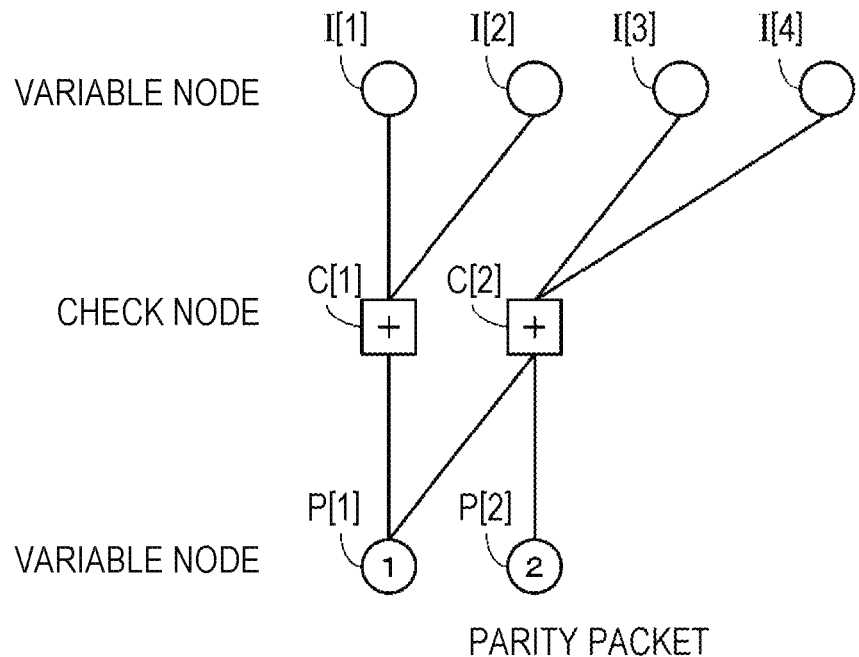
FIG. 31 is a Tanner graph for describing the present disclosure.
Figure 32:
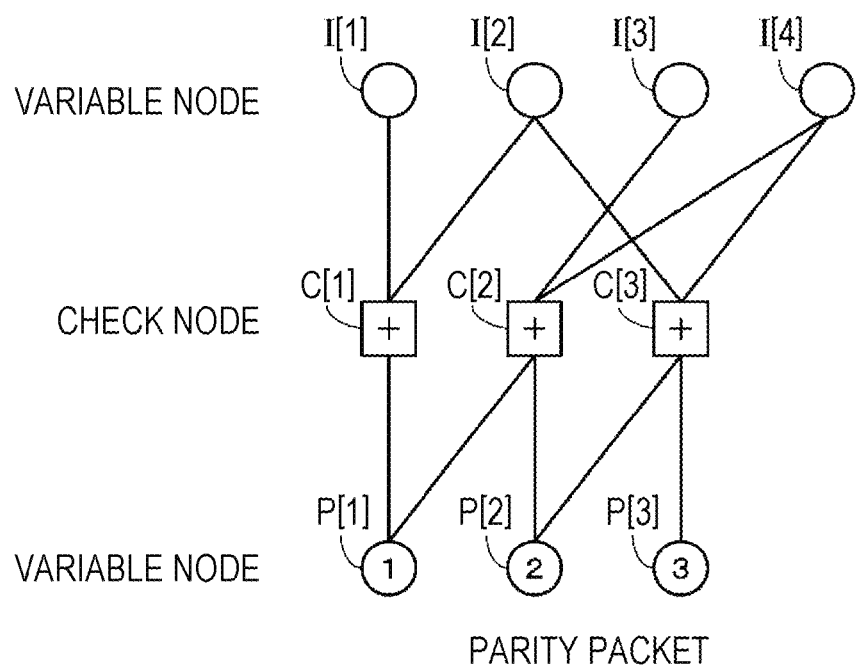
FIG. 32 is a Tanner graph for describing the present disclosure.
Figure 33:
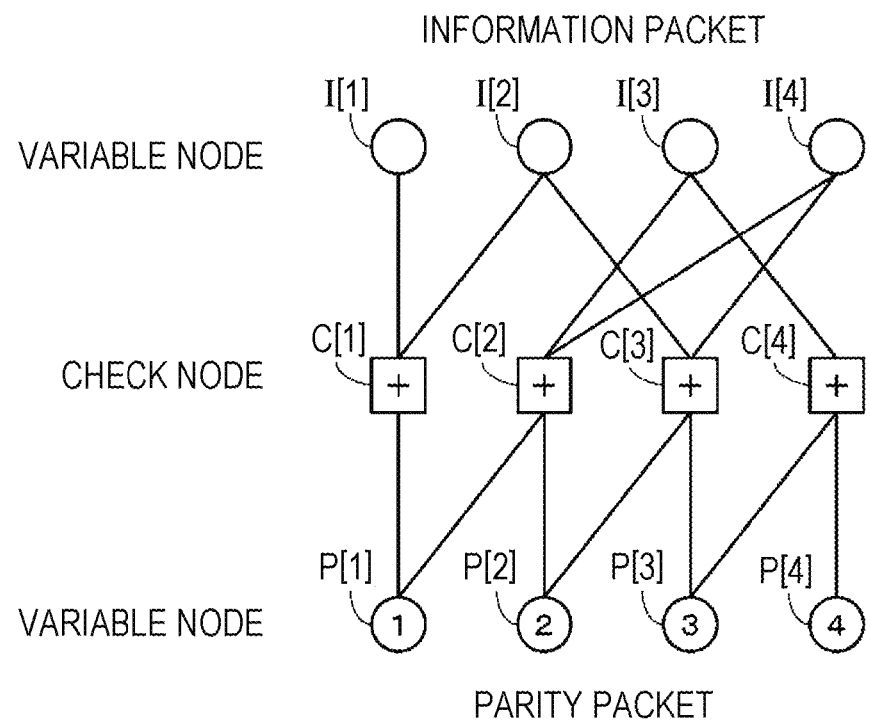
FIG. 33 is a Tanner graph for describing the present disclosure.

FIGS. 30 to 33 illustrate the processes in which a certain terminal receives parity packets sequentially from other terminals assuming that the Tanner graph in FIG. 29 is the final state and are diagrams for describing an operation in a case where there is no lost parity packet in the information packets and the parity packets. FIG. 30 illustrates the state where P[1] is received. P[1] is generated from the information packets 1 and 2. Therefore, the coding vector Vi[1] of P[1] has elements (that is, Vi[1]={1,2}). Since the source packet of P[1] is the information packet only (other parity packets are not used as the source), Vp[1] does not have an element. When P[1] is received, C[1] is connected according to the coding vectors Vp [1] and Vi[1] associated with P[1] so that C[1] is connected to P[1], I[1], and I[2]. FIG. 31 illustrates a state where the parity packet P[2] is received. Since P[2] is generated by I[3], I[4], and P[1], coding vectors Vi[2]={3,4} and Vp[2]={1} are obtained. Therefore, the receiving terminal connects C[2] according to Vi[2] and Vp[2] so that C[2] is connected to I[3], I[4], P[1], and P[2]. Similarly, FIG. 32 illustrates a state where the parity packet P[3] is received, and FIG. 33 illustrates a state where the parity packet P[4] is received.

In this manner, each check node connects source packets on the basis of information on the associated coding vectors Vi and Vp whenever a parity packet is received.

By way of an example in which the information packet I[1] and the parity packet P[1] are lost assuming the above-described operation, the effects of using other parity packets which have been generated and shared as well as the information packet in generation of the parity packets and the effect of transmitting the coding vector only will be described.

Figure 34:
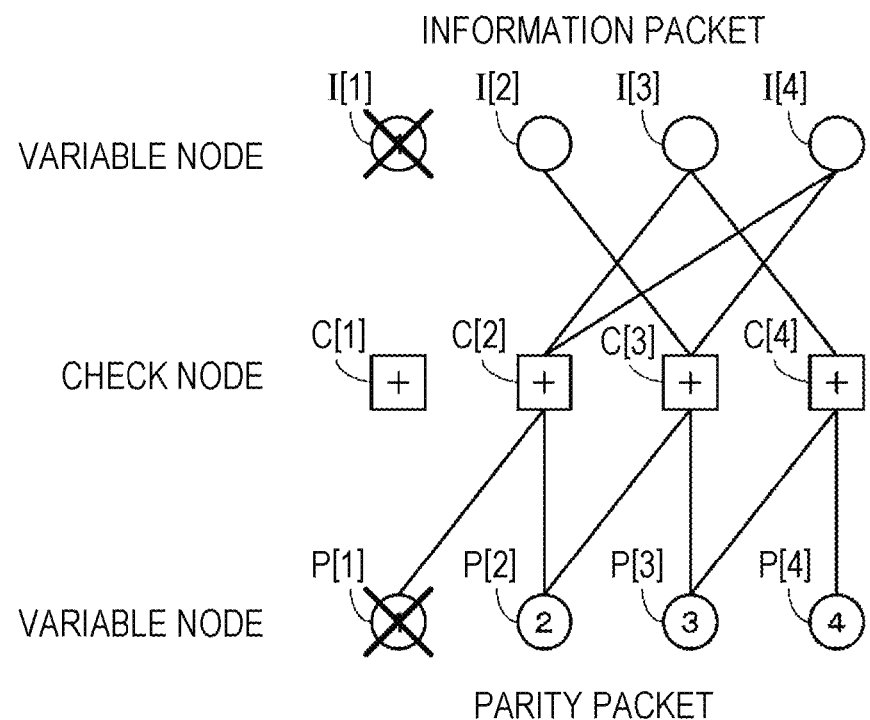
FIG. 34 is a Tanner graph for describing the present disclosure.

In a case where the information packet I[1] and the parity packet P[1] are lost, the state illustrated in FIG. 34 is created. Since the parity packet P[1] and the coding vectors Vi[1] and Vp[1] are transmitted to the local network after being combined by the encoding processing unit 32, in a case where the parity packet P[1] is lost during transmission on the local network, the associated coding vectors Vi[1] and Vp[1] are also lost. Therefore, in a case where P[1] is lost, a connection state (=the coding vector of the parity packet P[1]) of the check node C[1] is also unclear. From this state, it is possible to recover P[1] by the exclusive logical sum of I[3], [4], and P[2] with the aid of the connection information (connected by the coding vectors Vi[2] and Vp[2] of the parity packet P[2]) of the check node C[2]. This is the effect of using P[1] as the source packet of P[2] (the effect of using other generated and shared parity packets as well as the information packet). In this state, it is not possible to recover I[1] since the connection information of C[1] is not present.

Figure 35:
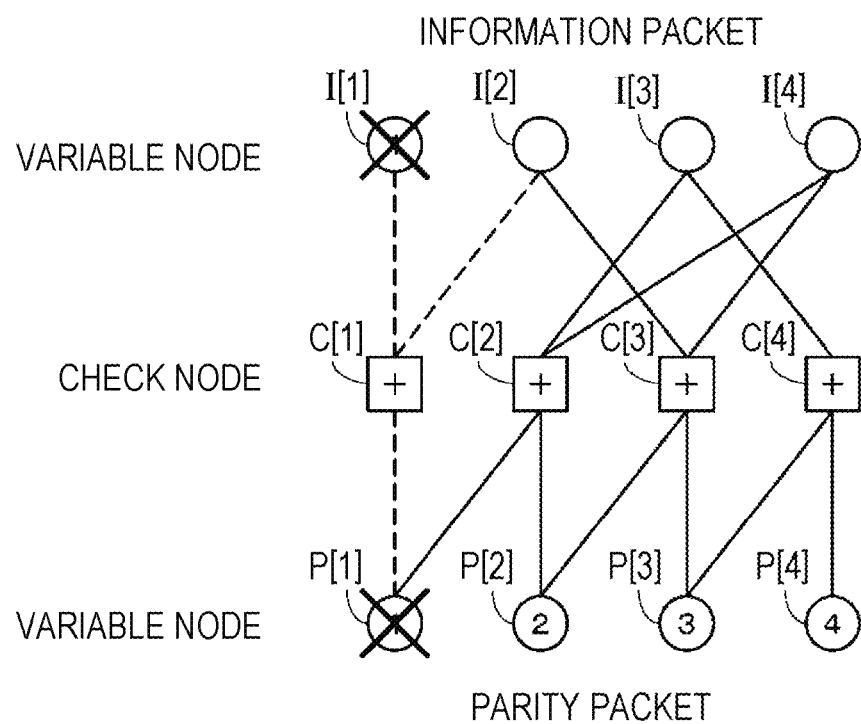
FIG. 35 is a Tanner graph for describing the present disclosure.

However, as illustrated in FIG. 35, in a case where the coding vectors Vi[1] and Vp[1] of the parity packet P[1] are multicast and received on the local network, it is possible to know the connection state (the connection indicated by a broken line) of the check node C[1] and to recover the information packet I[1]. That is, even in a case where P[1] is lost during transmission on the local network, when the coding vectors Vi[1] and Vp [1] are transmitted again without transmitting P[1] again, it is possible to recover the information packet I[1].

Figure 17:
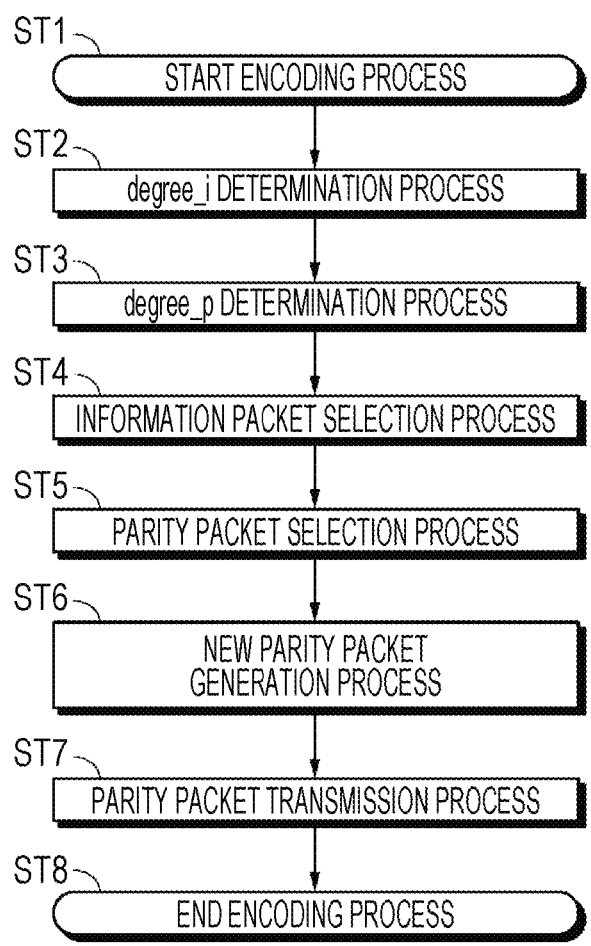
FIG. 17 is a flowchart for describing a process of an encoding processing unit.

FIG. 17 is a flowchart illustrating the flow of the process of the encoding processing unit 32.

In step ST1, an encoding process starts.

In step ST2, a degree_i determination process is performed. degree_i is the number of source information packets to be used for generation of a parity packet. A value between 1 and 12 is determined randomly as degree_i.

Alternatively, the degree_i is determined according to a certain probability distribution.

Alternatively, a predetermined fixed number may be used (for example, degree_i=8).

In step ST3, a degree_p determination process is performed. degree_p is the number of source parity packets to be used for generation of the parity packet.

A value between 0 and 4 is determined randomly as degree_p.

Alternatively, a predetermined fixed value may be used (for example, degree_p=1).

Figure 18:
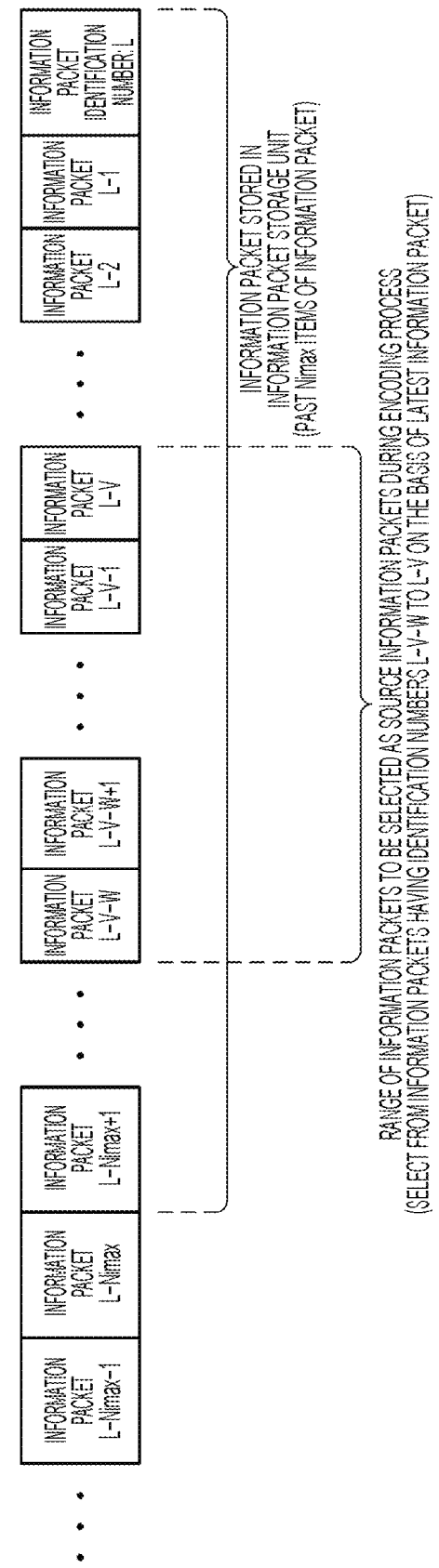
FIG. 18 is a schematic diagram for describing a selection range of an information packet to be used for generation of a parity.

In step ST4, an information packet selection process is performed. FIG. 18 illustrates a selection range of source information packets. degree_i information packets are selected as the source information packets.

One source information packet is selected from the information packets stored in the information packet storage unit 24.

The sel_prob values of the information packets are added up as total_prob.

For all information packets, the selection probability of the individual information packets InfoBuf[x] is defined as (InfoBuf[x].sel_prob/total_prob).

One information packet is selected randomly with the above probability.

In a case where the selected information packet is a lost packet (loss=1), an information packet is randomly selected again with the probability.

In a case where degree_i is 2 or more and an information packet which has been already selected as the source packet is selected again, an information packet is randomly selected again with the probability.

The above-described operations are repeated until degree_i information packets are selected.

After degree_i information packets are selected, the value of the selection probability sel_prob of the selected information packet is updated.

In a case where the selected information packet is InfoBuf [x], the selection probability is updated by the following computation.

$$InfoBuf[x].sel\_prob = InfoBuf[x].sel\_prob * update\_ratio$$

In a case where update_ratio is 0.1 or the like and the information packet InfoBuf [x] is selected as a generation source of the parity packet, the selection probability decreases.

In step ST5, a parity packet selection process is performed. degree_p parity packets are selected as the source parity packets.

The sel_prob values of all parity packets stored in the parity packet storage unit 26 are added up as total_prob.

A selection probability of a certain parity packet Parity-Buf [x] is defined as (ParityBuf [x].sel_prob/total_prob).

One information packet is selected randomly with the above-described probability.

In a case where the selected parity packet is a lost packet (loss=1), an information packet is randomly selected again with the probability.

In a case where a parity packet which has been already selected as the source packet is selected again, an information packet is randomly selected again with the probability.

The above-described operations are repeated until degree_p parity packets are selected.

After degree_p parity packets are selected, the value of the selection probability sel_prob of the selected information is updated.

In a case where the selected parity packet is ParityBuf [x], the selection probability is updated by the following computation.

$$ParityBuf[x].sel\_prob = ParityBuf[x].sel\_prob * update\_ratio$$

In a case where update_ratio is 0.1 or the like and the parity packet ParityBuf[x] is selected as a generation source, the selection probability decreases.

In step ST6, a new parity packet generation process is performed.

The exclusive logical sum of respective bits of the selected information packet and the parity packet is calculated to generate a new parity packet and the new parity packet is stored in the parity packet storage unit 26.

Moreover, a check node corresponding to the added new parity packet is added to the check node storage unit 27.

When a storage area for storing the new parity packet is ParityBuf[x], a storage area for adding the new check node is CheckNode[y], the source information packets are InfoBuf[a], InfoBuf[b], and InfoBuf[c], and the source parity packet is ParityBuf[d], ParityBuf[x] and CheckNode[y] store data in the following manner.

ParityBuf[x].loss=0

ParityBuf[x].term_id=Identification information of subject terminal

ParityBuf[x].parity_id=(number of generated parity packets of subject terminal+1)

ParityBuf[x].sel_prob=1.0
ParityBuf[x].data=InfoBuf[a].data^InfoBuf[b].data^InfoBuf[c].data
ParityBuf[d].data The exclusive logical sum of respective bits of the respective source packets is calculated and is used as the data of the parity packet.

CheckNode[y].info_degree=3
CheckNode[y].pInfo[0]=&InfoBuf[a]
CheckNode[y].pInfo[1]=&InfoBuf[b]
CheckNode[y].pInfo[2]=&InfoBuf[c]
CheckNode[y].parity_degree=1
CheckNode[y].pParity[0]=&ParityBuf[d]

In step ST7, a parity packet transmission process is performed.

This process involves appending a parity packet header to the newly generated parity packet and delivering the same to an RTP/UDP/IP protocol processing unit 30 as a parity packet transmission format.

A real-time transport protocol (RTP) is a protocol for transmitting video data and audio data in real-time via the Internet.

A user datagram protocol (UDP) is a communication protocol of a transport layer in which reliability is not guaranteed.

An Internet protocol (IP) is a protocol of the Internet layer.

Figure 19:
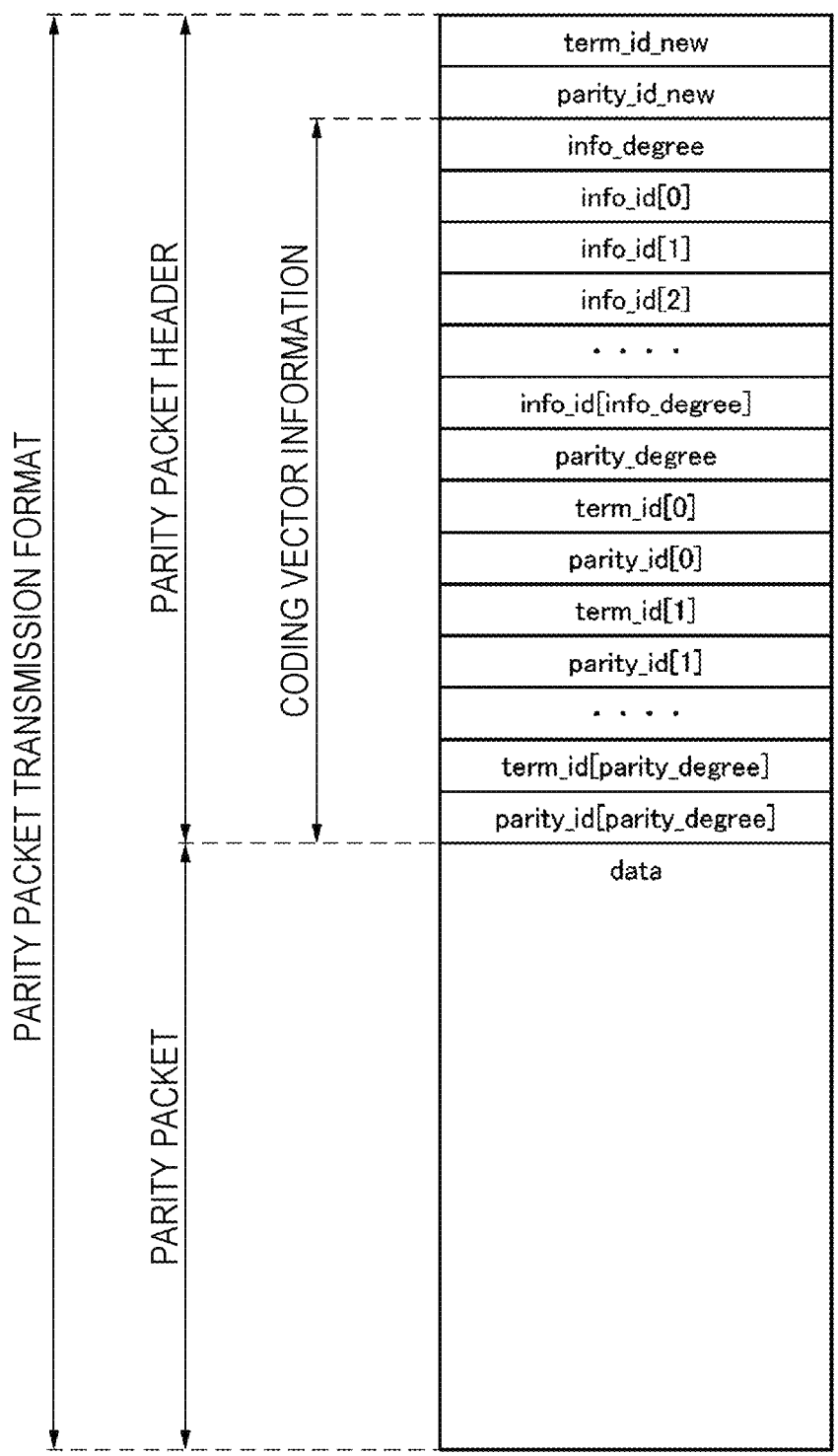
FIG. 19 is a schematic diagram for describing a parity packet transmission format.

FIG. 19 illustrates a parity packet transmission format.

A parity packet header portion is an area in which the identification information of a newly generated parity packet and source packet information (coding vector information) are stored.

Data is set to the parity packet header potion and the coding vector information in the following manner.

term_id_new: Terminal identification information of parity generating terminal (subject terminal)
    parity_id_new: parity_id of newly generated parity packet
    info_degree: CheckNode[y].info_degree
    info_id[0]: CheckNode[y].pInfo[0]->info_id
    info_id[1]: CheckNode[y].pInfo[1]->info_id
    . . . (continued for info_degree)
    parity_degree: CheckNode[y].parity_degree
    term_id[0]: CheckNode[y].pParity[0]->term_id
    parity_id[0]: CheckNode[y].Pparity[0]->parity_id
    term_id[1]: CheckNode[y].pParity[1]->term_id
    parity_id[1]: CheckNode[y].Pparity[1]->parity_id
    . . . (continued for parity_degree)

The process of the RTP/UDP/IP protocol processing unit 30 will be described.

Transmission Process

A plurality of parity packet transmission formats output from the encoding processing unit 32 is combined according to a maximum transmission unit (MTU: the maximum size of data that can be transmitted at a time via a network) of the local network, a packetization process is performed according to respective standard protocols, a predetermined multicast address is set to a destination IP address, and the packets are multicast to the local network.

A plurality of items of coding vector information output from the control unit 28 is combined according to the MTU or the like of the local network, a packetization process is performed according to respective standard protocols, a predetermined multicast address is set to a destination IP address, and the packets are multicast to the local network.

Reception Process

In a case where an IP/UDP/RTP packet having the parity packet transmission format in its payload is received in a local network interface unit 29, the parity packet transmission format which is the payload is delivered to the parity packet input unit 31. Ina case where a plurality of parity packet transmission formats is included as the payload of the IP/UDP/RTP packet, the parity packet transmission formats are split into individual parity packet formats and is delivered to the parity packet input unit 31.

In a case where an IP/UDP/RTP packet having the coding vector information in its payload is received in the local network interface unit 29, the coding vector information is delivered to the control unit 28. In a case where a plurality of items of coding vector information is included as the payload of the IP/UDP/RTP packet, the plurality of items of coding vector information is divided into individual items of coding vector information and is delivered to the control unit 28.

The parity packet input unit 31 performs a process of adding packets to the parity packet storage unit 26 and the check node storage unit 27 according to the input parity packet transmission format.

The flow of the process of the parity packet input unit 31 will be described with reference to the flowchart of FIG. 20. The process of FIG. 20 is executed when the parity packet transmission format is input to the parity packet input unit 31.

Hereinafter, the process flow of the parity packet input unit 31 will be described. Note that the terms are defined as follows. A parity packet included in the parity transmission format input to the parity packet input unit 31 is denoted as a "reception parity packet" and a parity packet which is already present in the parity packet storage unit 26 is denoted as an "existing parity packet".

In step ST11, the process of the packet input unit 31 starts.

In step ST12, a process of acquiring a vacant area of the parity packet storage unit is performed.

An area that stores the reception parity packet is acquired from a vacant area of the parity packet storage unit 26. Hereinafter, the area of the acquired reception parity packet is expressed as ParityBuf[x].

In step ST13, a process of acquiring a vacant area of the check node storage unit is performed.

The area for storing the added check node is acquired from the vacant area of the check node storage unit 27. Hereinafter, the acquired area is expressed as CheckNode[y].

In step ST14, a reception parity packet adding process is performed.

According to the information of the parity packet transmission format, data is stored in ParityBuf[x] in the following manner.

ParityBuf[x].loss=0
    ParityBuf[x].term_id=term_id_new of parity header
    ParityBuf[x].parity_id=parity_id_new of parity header
    ParityBuf[x].sel_prob=1.0
    ParityBuf[x].data=data portion (188 bytes) of parity packet In step ST15, a parity packet connection process is performed.

A process of connecting the check node CheckNode[y] and the existing parity packet is performed according to the coding vector information.

In step ST16, an information packet connection process is performed.

A pointer to an information packet of a check node is set and a process of connecting the check node and the information packet is performed.

Figure 21:
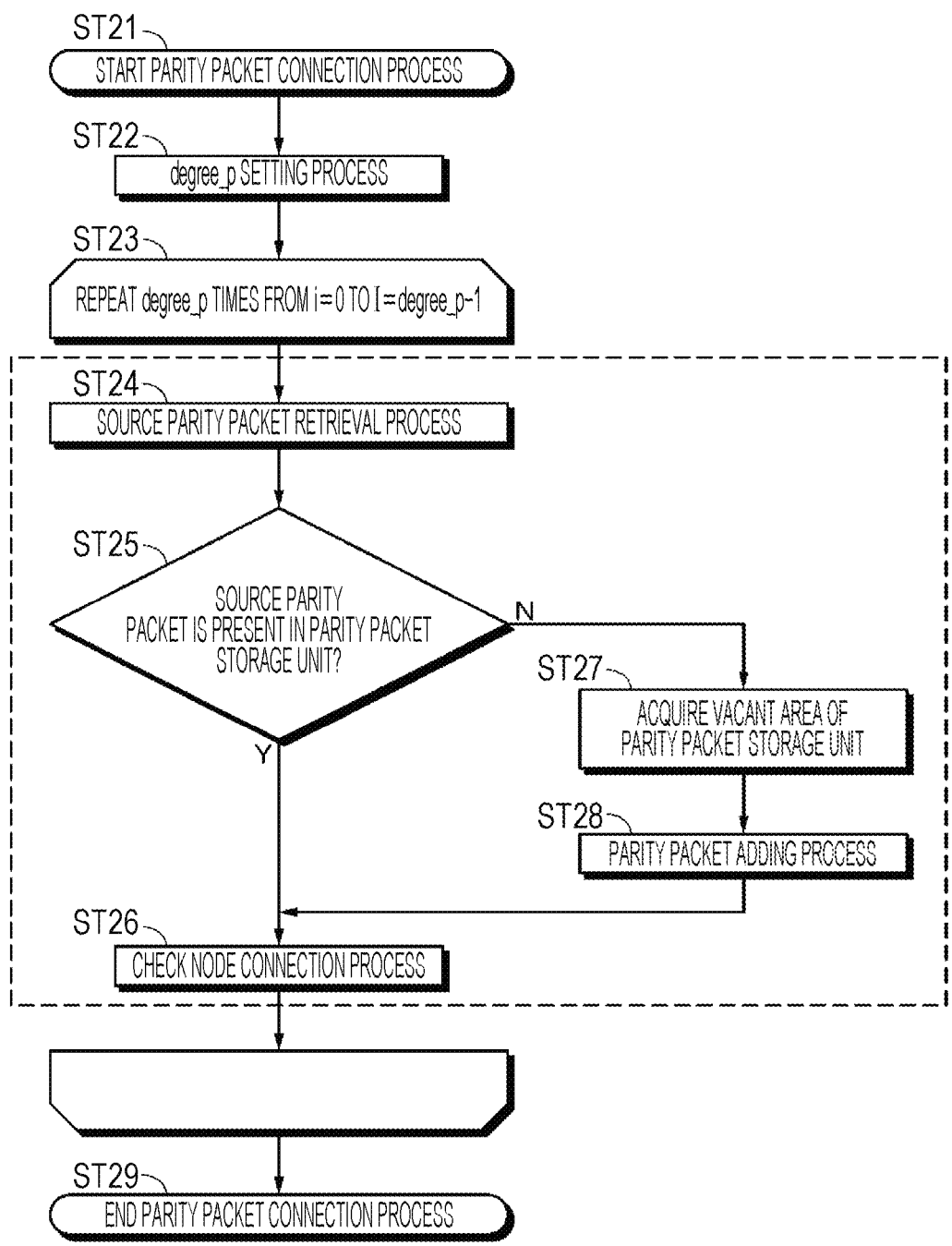
FIG. 21 is a flowchart for describing a parity packet connection process.

The flowchart of FIG. 21 illustrates a parity packet connection process (step ST15). Hereinafter, the process will be described according to this flowchart.

In step ST21, a connection process starts.

In step ST22, a degree_p setting process is performed.

The number of source packets of the parity packet is stored in degree_p of the added check node as follows.

CheckNode[y].degree_p=degree_p of coding vector information

In step ST23, a process of connecting the check node and the parity packet is performed as indicated in a dotted frame in FIG. 21.

This process is performed repeatedly from i=0 to i=degree_p−1. Hereinafter, this process will be described.

In step ST24, a source parity packet retrieval process is performed.

A parity packet having the same terminal identification information and the same parity packet identification information as term_id[i] and parity_id[i] of the coding vector information is retrieved within the parity packet storage unit 26.

In step ST25, it is determined whether the source parity packet is present in the parity packet storage unit 26.

In the following description, an area for storing the source parity packet if the source parity packet is present in the parity packet storage unit 26 will be expressed as ParityBuf[z].

If it is determined in step ST25 that the source parity packet is present in the parity packet storage unit 26, the flow proceeds to a check node connection process ST26. If it is determined in step ST25 that the source parity packet is not present, the flow proceeds to a process ST27 of acquiring a vacant area of the parity packet storage unit.

In step ST27, a process of acquiring a vacant area from the parity packet storage unit 26 is performed. Hereinafter, the acquired parity packet area will be expressed as ParityBuf[z].

In step ST28, a parity packet adding process is performed. Data is stored in ParityBuf[z] as follows.

ParityBuf[z].loss=1

ParityBuf[z].term_id=term_id[i] of coding vector information

ParityBuf[z].parity_id=parity_id[i] of coding vector information

ParityBuf[z].sel_prob=1.0

It is not necessary to store data in ParityBuf[z].data.

In step ST26, a check node connection process is performed.

A pointer to a parity packet of a check node is set as follows, and the check node and the parity packet are connected.

CheckNode[y].pParity[i]=&ParityBuf[z]

In step ST29, the parity packet connection process ends.

Figure 22:
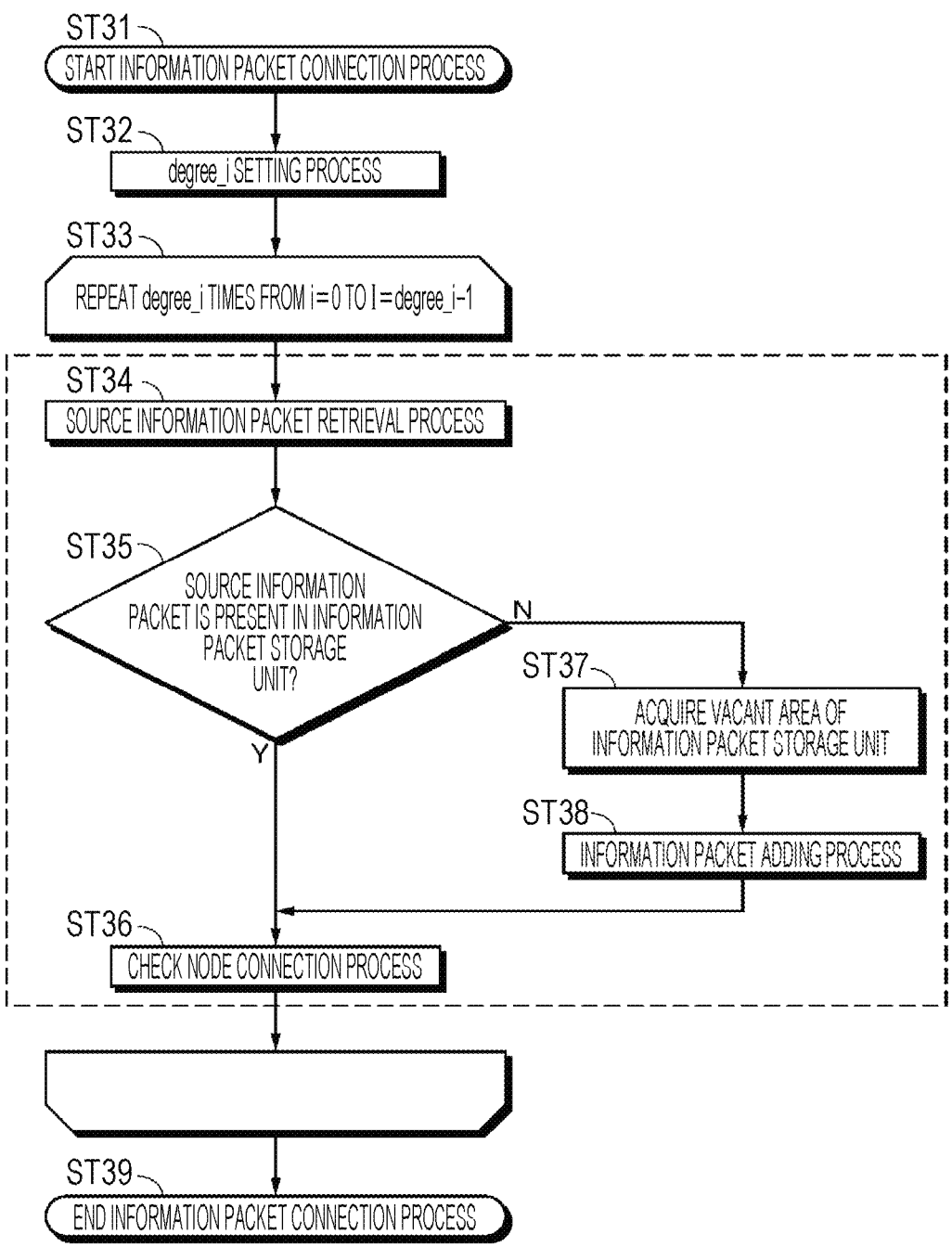
FIG. 22 is a flowchart for describing an information packet connection process.

The flowchart of FIG. 22 illustrates an information packet connection process (step ST16). A process of connecting the check node and the information packet is performed according to the coding vector information. Hereinafter, the process will be described with reference to the flowchart.

In step ST31, a connection process starts.

In step ST32, a degree_p setting process is performed.

The number of source packets of the parity packet is stored in degree_i of the added check node as follows.

CheckNode[y].degree_i=degree_i of coding vector information

In step ST33, a process of connecting the check node and the information packet is performed as indicated by a dotted frame in FIG. 22.

This process is performed repeatedly from i=0 to i=degree_i−1. Hereinafter, this process will be described.

In step ST34, a source parity packet retrieval process is performed.

An information packet having the same identification information as info_id[i] of the coding vector information is retrieved within the information packet storage unit 24.

In step ST35, it is determined whether the source information packet is present in the information packet storage unit 24.

In the following description, a source information packet if the source information packet is present in the information packet storage unit 24 will be expressed as InfoBuf[z].

If it is determined in step ST35 that the source information packet is present in the information packet storage unit 24, the flow proceeds to the check node connection process ST36. If it is determined in step ST35 that the source information packet is not present, the flow proceeds to a process ST37 of acquiring a vacant area of the information packet storage unit.

In step ST37, a process of acquiring a vacant area from the information packet storage unit 24 is performed. Hereinafter, the acquired information packet area will be expressed as InfoBuf[z].

In step ST38, an information packet adding process is performed. Data is stored in InfoBuf[z] as follows.

Data is stored in InfoBuf[z] as follows.

InfoBuf[z].loss=1

InfoBuf[z].info_id=info_id[i] of coding vector information

InfoBuf[z].sel_prob=1.0

It is not necessary to store data in InfoBuf[z].data.

In step ST36, a check node connection process is performed.

A pointer to an information packet of a check node is set as follows, and the check node and the information packet are connected.

CheckNode[y].pInfo[i]=&InfoBuf[z]

In step ST39, a parity packet connection process ends.

Figure 20:
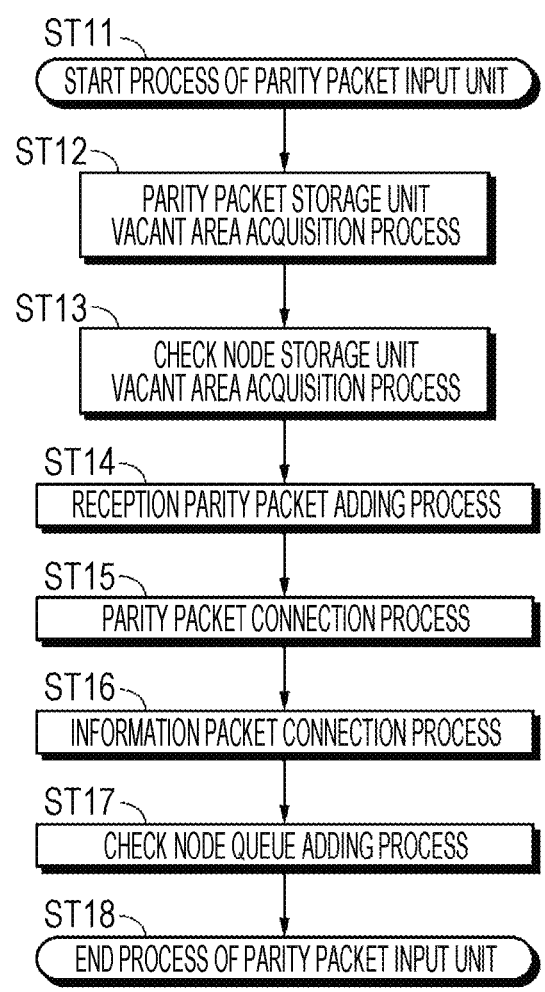
FIG. 20 is a flowchart for describing a process of a parity packet input unit.

Description will be continued with reference to the flowchart of FIG. 20.

In step ST17, a check node queue adding process is performed.

CheckNode[y] is added to the check node queue of the decoding processing unit 25.

In step ST18, the process of the parity packet input unit ends.

The process of the decoding processing unit 25 will be described with reference to the flowchart of FIG. 23.

In step ST41, a decoding process starts.

In step ST42, it is determined whether the number of items in the check node queue is 0.

Figure 24:
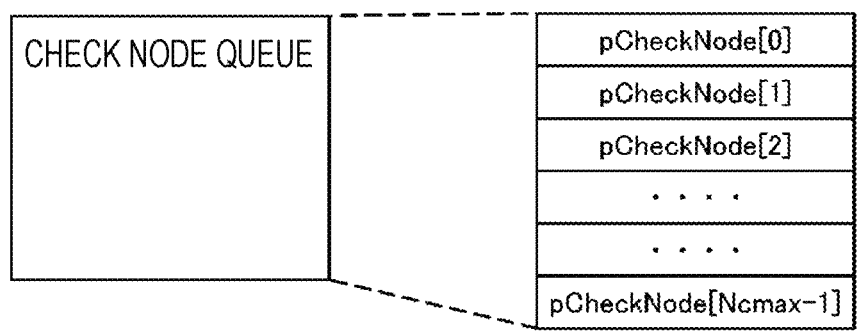
FIG. 24 is a schematic diagram for describing a check node queue.

As illustrated in FIG. 24, the check node queue is a first-in first-out (FIFO)-type buffer in which pointers to check nodes required for the process are included as its elements.

In a case where it is determined in step ST42 that the number of check nodes registered in the check node queue is 0, the decoding process ends (step ST43).

In a case where it is determined in step ST42 that a check node which waits for processing is present in the check node queue, the flow proceeds to a check node acquisition process (step ST44).

In step ST44, a check node acquisition process is performed to extract a check node which waits for processing from the check node queue. In the following description, the extracted check node will be expressed as CheckNode[x].

In step ST45, a process is performed on the extracted check node.

Figure 25:
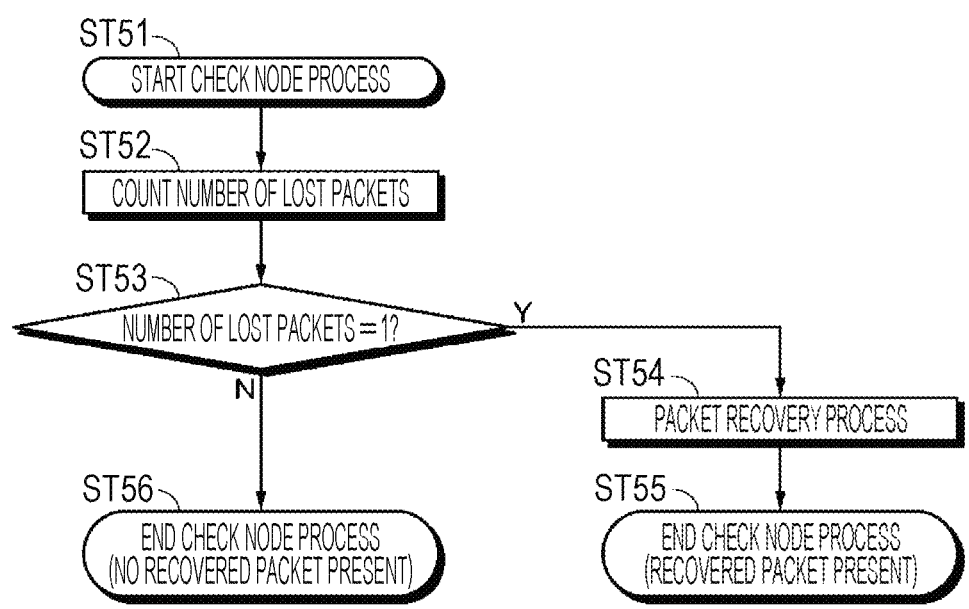
FIG. 25 is a flowchart for describing a check node process.

The flowchart of FIG. 25 illustrates a check node process. The check node process will be described below.

In step ST51, a check node process starts.

In step ST52, the number of lost packets is counted. In step ST52, it is determined whether there is a lost packet with respect to all information packets and all parity packets connected to CheckNode[x], and the number of lost packets is counted. Whether a packet is lost is determined on the basis of a loss flag (a loss value).

In step ST53, it is determined whether the number of lost packets is 1.

In step ST54, in a case where the number of lost packets is 1, a packet recovery process is performed. When a packet for which the recovery process is performed is InfoBuf[x], the recovery process is performed as follows. A check node process ends (a recovered packet is present).

InfoBuf[x].data={Exclusive logical sum of data portions of other packets connected to CheckNode[x]}

InfoBuf[x].loss=0

In step ST53, in a case where the number of lost packets is not 1, the packet recovery process is not performed, and the check node process ends (a recovered packet is not present).

Figure 23:
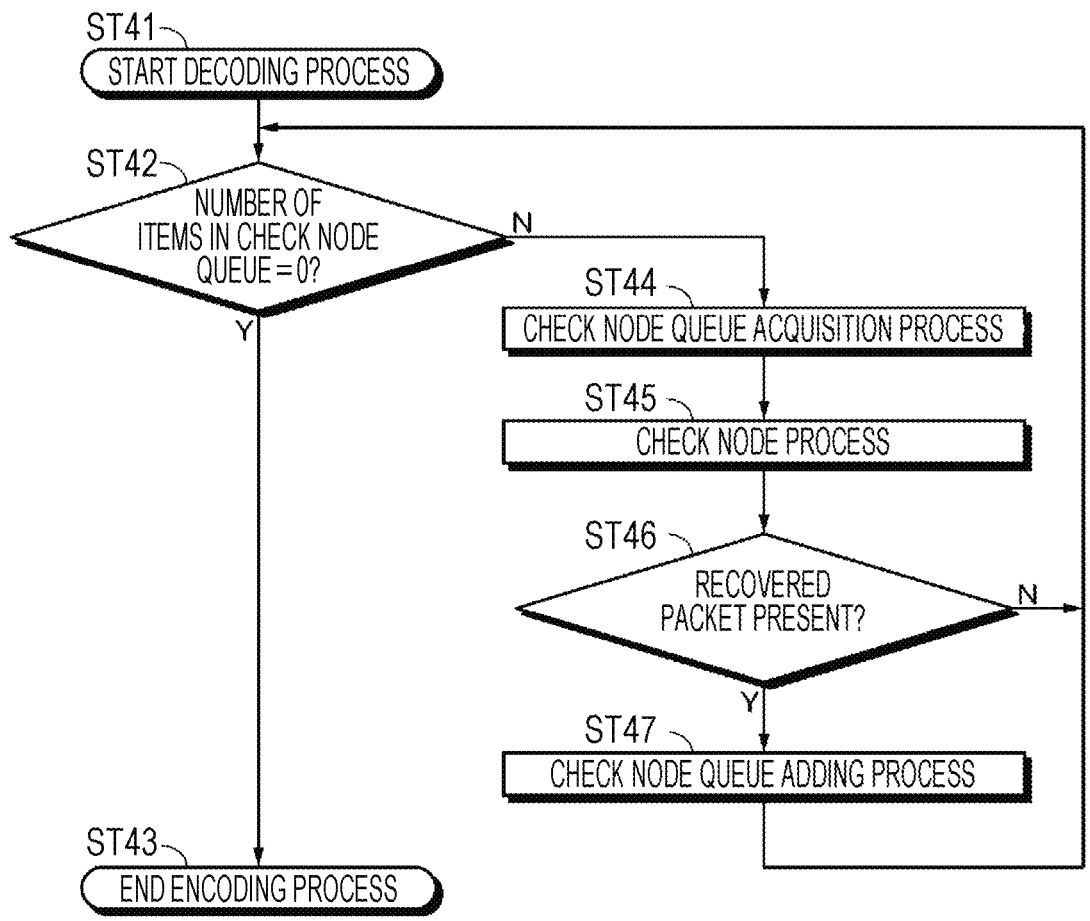
FIG. 23 is a flowchart for describing a process of a decoding processing unit.

Returning to the flowchart of FIG. 23, when the check node process (step ST45) ends, the flow proceeds to step ST46.

In step ST46, it is determined whether a recovered packet is present. In a case where a recovered packet is not present, the flow returns to a check node acquisition process (step ST42).

In step ST47, in a case where it is determined that a recovered packet is present, a check node queue adding process is performed.

In the check node adding process, a check node connected to the recovered packet InfoBuf [x] is retrieved within the check node storage unit 27, and the check node connected to InfoBuf [x] is added to the check node queue.

After the check node adding process ends, the flow returns to a check node acquisition process (step ST42).

An information packet output unit 33 selects the oldest information packet among the information packets stored in the information packet storage unit 24 and outputs a data portion thereof to a conditional access system (CAS) descrambling unit 34 in the next stage. The order of information packets can be determined from the identification information. The area of the information packet output to the next stage becomes a vacant area.

The CAS descrambling unit 34 performs a conditional access descrambling process. The output of the CAS descrambling unit 34 is supplied to a DEMUX and A/V decoding unit 35. The DEMUX and A/V decoding unit 35 demultiplexes and decodes the MPEG2-TS output from the information packet output unit 33 and outputs video and audio data. The video and audio data is supplied to a display unit 36. The display unit 36 displays video data and outputs audio.

In the present embodiment, the parity packet is generated and shared using the information packet before being descrambled by the CAS descrambling unit 34. Since the parity packet is generated and shared using the information packet which has been scrambled, it is possible to share data via the local network in a state where the copyright is protected.

The control unit 28 controls operation parameters and timings of respective functions and monitors the states of respective functions. Control and monitoring of the respective functions will be described below.

The control and monitoring of the encoding processing unit 32 involves indicating an execution timing of the process.

Figure 26:
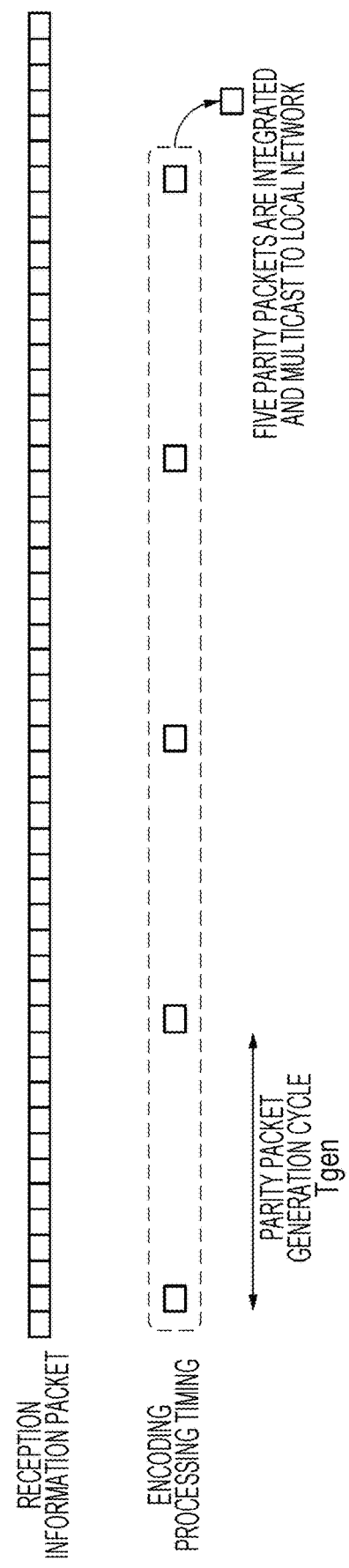
FIG. 26 is a timing chart for describing the timings of an encoding process.

FIG. 26 is a diagram for describing the timing of the encoding process of the encoding processing unit 32.

As illustrated in FIG. 26, at a time point at which an encoding process is performed in a parity packet generation cycle Tgen and five parity packets are generated, the RTP/UDP/IP protocol processing unit 30 combines the five parity packets and multicasts the combined parity packet to the local network via the local network interface unit 29.

The control unit 28 instructs execution of the process of the encoding processing unit 32 in the parity packet generation cycle on the basis of the information packet input timing obtained from the parity packet input unit 31.

A coding vector information transmission process will be described.

Coding vector information is generated from the information on the check node corresponding to the parity packet generated by a subject terminal, stored in the check node storage unit 27, and is output to the RTP/UDP/IP protocol processing unit 30. This process is performed in a predetermined cycle.

The check node used for generation of the coding vector information is selected randomly by the check node storage unit 27.

FIG. 27 illustrates coding vector information. When the check node selected from the check node storage unit 27 is CheckNode[y], the elements of the coding vector is determined as follows.

info_degree: CheckNode[y].info_degree
info_id[0]: CheckNode[y].pInfo[0]->info_id
info_id[1]: CheckNode[y].pInfo[1]->info_id
. . . [Continued for info_degree]
parity_degree: CheckNode[y].parity_degree
term_id[0]: CheckNode[y].pParity[0]->term_id
parity_id[0]: CheckNode[y].Pparity[0]->parity_id
term_id[1]: CheckNode[y].pParity[1]->term_id
parity_id[1]: CheckNode[y].Pparity[1]->parity_id
. . . [Continued for parity_degree]

By transmitting the coding vector information, it is possible to allow other terminals to acquire the configuration information (the source packet information) of a parity packet which could not been received by other terminals due to reasons such as a packet loss on the local network although the parity packet was transmitted from the subject terminal and to generate the check node Transmission of the coding vector information enables the recovery function to be achieved for a packet loss on the local network.

The coding vector information receiving process will be described.

A check node is added to the check node storage unit 27 according to the coding vector information obtained from the RTP/UDP/IP protocol processing unit 30.

The flowchart of FIG. 28 illustrates the process when the coding vector is received. Hereinafter, the respective processes of the flowchart will be described.

In step ST61, a coding vector input process starts.

In step ST62, a check node retrieval process is performed.

The same check node (a check node in which the identification information of all packets connected thereto is identical to that of the received coding vector information) as the received coding vector information is retrieved within the check node storage unit 27.

In step ST63, it is determined whether the same check node is present. This process ends in a case where the same check node is present (step ST64).

In step ST65, in a case where it is determined in step ST63 that the same check node is not present, a process of acquiring a vacant area of the check node storage unit is performed.

The parity packet connection process (step ST66), the information packet connection process (step ST67), and the check node queue adding process (step ST68) subsequent to the check node storage unit vacant area acquisition process (step ST65) are the same as the processes of the parity packet input unit 31 described with reference to the flowcharts of FIGS. 20, 21, and 22.

The effects of the present disclosure will be described with reference to the Tanner graphs of FIGS. 29 to 35.

As an example, symbols illustrated in the Tanner graph of FIG. 29 will be described. In the present disclosure, a check node is provided between an information packet and a parity packet. Parity packets P[1], P[2], P[3], and P[4] and information packets I[1], I[2], I[3], and I[4] are connected via check nodes C[1], C[2], C[3], and C[4]. The parity packets are generated and transmitted in the order of P[1], P[2], P[3], and P[4]. Moreover, in the encoding processing unit 32, the parity packet and the associated coding vector are combined as a parity packet transmission format and are transmitted on the local network.

A set of identification numbers of the source information packets of the parity packet P[x] is expressed as Vi[x]={vi[x, 0], vi[x, 1], . . . , vi[x, di[x]−1]}. Here, di[x] is the number of source information packets of P[x]. A set of identification numbers of source parity packets of the parity packet P[x] is expressed as Vp[x]={vp[x, 0], vp[x, 1], . . . , vp[x, dp[1]−1]}. Here, dp[x] is the number of source parity packets of P[x]. For example, since P[2] in FIG. 29 is generated from the information packets I[3] and I[4] and the parity packets P[1], the coding vectors Vi[2] and Vp[2] can be expressed as follows.

$$di[2]=2$$

$$Vi[2]=\{vi[2,0],vi[2,1]\}=\{3,4\}$$

$$dp[2]=1$$

$$Vp[2]=\{vp[2,0]\}=\{1\}$$

FIGS. 30 to 33 illustrate the processes in which a certain terminal receives parity packets sequentially from other terminals assuming that the Tanner graph in FIG. 29 is the final state and are diagrams for describing an operation in a case where there is no lost parity packet in the information packets and the parity packets. FIG. 30 illustrates the state where P[1] is received. P[1] is generated from the information packets 1 and 2. Therefore, the coding vector Vi[1] of P[1] has elements (that is, Vi[1]={1,2}). Since the source packet of P[1] is the information packet only (other parity packets are not used as the source), Vp[1] does not have an element. When P[1] is received, C[1] is connected according to the coding vectors Vp [1] and Vi[1] associated with P[1] so that C[1] is connected to P[1], I[1], and I[2]. FIG. 31 illustrates a state where the parity packet P[2] is received. Since P[2] is generated by I[3], I[4], and P[1], coding vectors Vi[2]={3, 4} and Vp[2]={1} are obtained. Therefore, the receiving terminal connects C[2] according to Vi[2] and Vp[2] so that C[2] is connected to I[3], I[4], P[1], and P[2]. Similarly, FIG. 32 illustrates a state where the parity packet P[3] is received, and FIG. 33 illustrates a state where the parity packet P[4] is received.

In this manner, each check node connects source packets on the basis of information on the associated coding vectors Vi and Vp whenever a parity packet is received.

By way of an example in which the information packet I[1] and the parity packet P[1] are lost assuming the above-described operation, the effects of using other parity packets which have been generated and shared as well as the information packet in generation of the parity packets and the effect of transmitting the coding vector only will be described.

In a case where the information packet I[1] and the parity packet P[1] are lost, the state illustrated in FIG. 34 is created. Since the parity packet P[1] and the coding vectors Vi[1] and Vp[1] are transmitted to the local network after being combined by the encoding processing unit 32, in a case where the parity packet P[1] is lost during transmission on the local network, the associated coding vectors Vi[1] and Vp[1] are also lost. Therefore, in a case where P[1] is lost, a connection state (=the coding vector of the parity packet P[1]) of the check node C[1] is also unclear. From this state, it is possible to recover P[1] by the exclusive logical sum of I[3], [4], and P[2] with the aid of the connection information (connected by the coding vectors Vi[2] and Vp [2] of the parity packet P[2]) of the check node C[2]. This is the effect of using P[1] as the source packet of P[2] (the effect of using other generated and shared parity packets as well as the information packet). In this state, it is not possible to recover I[1] since the connection information of C[1] is not present.

However, as illustrated in FIG. 35, in a case where the coding vectors Vi[1] and Vp[1] of the parity packet P[1] are multicast and received on the local network, it is possible to know the connection state (the connection indicated by a broken line) of the check node C[1] and to recover the information packet I[1]. That is, even in a case where P[1] is lost during transmission on the local network, when the coding vectors Vi[1] and Vp[1] are transmitted again without transmitting P[1] again, it is possible to recover the information packet I[1].

According to the above-description, in a case where there is a possibility that a parity packet is lost on a local network, other parity packets which have been generated and shared as well as an information packet are used for generating parity packets. It is possible to recover the lost parity packet. Moreover, it is possible to achieve a function of recovering a lost information packet by retransmitting a coding vector which was generated in the past. Furthermore, since the coding vector information does not contain transmission data (a payload) and has a small information amount, the load on the local network during transmission is small and it is possible to recover lost data efficiently.

The embodiments of the present disclosure provide the following effects.

(1) A space diversity effect is obtained and the reception quality is improved.

(2) Since a diversity effect is obtained between freely movable terminals as compared to general antenna diversity, the fading correlation is low and a high diversity effect can be obtained.

(3) There is no limitation on the number of terminals and the reception quality of many terminals can be improved simultaneously.

(4) Since parity packets are shared by a plurality of terminals at the same time, the load of the local network is small.

(5) The embodiments also achieve error control of a packet loss on a local network.

(6) By updating the probability of selecting a source packet when generating parity packets, it is possible to generate highly efficient parity packets.

Note that the present disclosure can be embodied in the configurations described below.

(1) A communication device including:
a function of receiving an information packet transmitted from a base station;
a communication function of connecting to a local network for sharing information among a plurality of terminals;
a function of generating a parity packet; and
a function of multicasting the generated parity packet and identification information of all source packets to the local network.

(2) A communication device including:
a function of receiving an information packet transmitted from a base station;
a function of receiving a parity packet multicast by other terminals and identification information of all source packets via a local network;
a function of storing the received parity packet and the identification information of all source packets in a storage unit; and a function of recovering a lost packet using the parity packet and the identification information of all source packets.

(3) A communication device including:
a function of receiving an information packet transmitted from a base station;
a communication function of connecting to a local network for sharing information among a plurality of terminals;
a function of generating a parity packet;
a function of multicasting the generated parity packet and identification information of all source packets to the local network;
a function of receiving the parity packet multicast by other terminals and the identification information of all source packets via the local network;
a function of storing the received parity packet and the identification information of all source packets in a storage unit; and
a function of recovering a lost packet using the parity packet and the identification information of all source packets.

(4) The communication device according to anyone of (1), (2), and (3), in which
a plurality of information packets is selected from information packets which could have been received correctly or could have been recovered, and error correction coding (ECC) is performed on the selected information packets to generate one or a plurality of parity packets.

(5) The communication device according to any one of (1), (2), and (3), in which
one or a plurality of information packets is selected from information packets which could have been received correctly or could have been recovered, and an exclusive logical sum of respective bits of the selected information packet is calculated to generate the parity packet.

(6) The communication device according to (5), in which one or a plurality of source packets to be used for generation of the parity packet is selected randomly.

(7) The communication device according to any one of (1), (2), and (3), in which
one or a plurality of information packets and a parity packet having been generated already are selected, and an exclusive logical sum of respective bits of the packets is calculated to generate the parity packet.

(8) The communication device according to (7), in which
when the source packet is selected randomly, a selection probability is changed according to the number of previous selections.

(9) The communication device according to (1) or (2), in which
generation source information of a parity packet which has been transmitted only is multicast on the local network.

(10) The communication device according to anyone of (1), (2), and (3), in which
a sequence number or a timestamp in an information packet is used as the identification information of the source information packet.

(11) The communication device according to anyone of (1), (2), and (3), in which
the identification information of the source information packet is generated from a PCR value of MPEG2-TS.

(12) The communication device according to anyone of (1), (2), and (3), in which
the identification information of the source information packet is generated from a continuity counter of an MPEG2-TS packet header.

(13) The communication device according to anyone of (1), (2), and (3), in which
the identification information of the source information packet is generated by combining PCR values of a plurality of programs multiplexed in MPEG2-TS and continuity counters of a plurality of PIDs.

(14) The communication device according to (6), in which the identification information of the source parity packet is generated from information unique to a parity packet generation device and the number of parity packets having been generated already by the terminal.

(15) The communication device according to (1) or (3), in which
a packet having the same identification information as the source packet of a received parity packet is retrieved from the storage unit, and when there is only one lost packet in the source packets, a lost packet is recovered by calculating an exclusive logical sum of the received parity packet and other source packets.

(16) A communication system including:
a plurality of terminals that receives an information packet multicast or broadcast from a base station; and
a network for sharing information among the plurality of terminals, in which
the plurality of terminals shares a parity packet by mutually transmitting and receiving the parity packet a plurality of times so that an information packet which could not have been received correctly by respective terminals is recovered.

(17) The communication system according to (16), in which
one or a plurality of terminals of the plurality of terminals is a first communication device that generates and transmits a parity packet only and the other terminals are second communication devices,
the first communication device includes:
a function of receiving an information packet transmitted from a base station;
a communication function of connecting to a local network for sharing information among a plurality of terminals;
a function of generating the parity packet; and
a function of multicasting the generated parity packet and identification information of all source packets to the local network, and the second communication device includes:
a function of receiving an information packet transmitted from the base station;
a function of receiving the parity packet multicast by the first communication device and identification information of all source packets via the local network;
a function of storing the received parity packet and the identification information of all source packets in a storage unit; and
a function of recovering a lost packet using the parity packet and the identification information of all source packets.

(18) The communication system according to (16), in which
each of the plurality of terminals includes:
a function of receiving an information packet transmitted from a base station;
a communication function of connecting to a local network for sharing information between a plurality of receiving terminals;
a function of generating a parity packet;
a function of multicasting the generated parity packet and identification information of all source packets to the local network;
a function of receiving the parity packet multicast by other terminals and identification information of all source packets via the local network;
a function of storing the received parity packet and the identification information of all source packets in a storage unit; and
a function of recovering a lost packet using the parity packet and the identification information of all source packets.

(19) A communication method including:
allowing a plurality of terminals to receive an information packet multicast or broadcast from a base station so that information is shared among the plurality of terminals via a network; and
allowing the plurality of terminals to share a parity packet by mutually transmitting and receiving the parity packet a plurality of times so that an information packet which could not have been received correctly by respective terminals is recovered.

(20) A program for causing a computer to execute a communication method including:
a step of receiving an information packet transmitted from a base station;
a communication step of connecting to a local network for sharing information among a plurality of terminals;
a step of generating a parity packet;
a step of multicasting the generated parity packet and identification information of all source packets to the local network;
a step of receiving the parity packet multicast by other terminals and the identification information of all source packets via the local network;
a step of storing the received parity packet and the identification information of all source packets in a storage unit; and
a step of recovering a lost packet using the parity packet and the identification information of all source packets.

4. Modification

Although the embodiments of the present disclosure have been specifically described, the present disclosure is not limited to the above-described embodiments, which can be variously modified based on the technical ideas according to the present disclosure. For example, the present disclosure may regard an aggregate of a plurality of TS packets as one packet. Furthermore, packets other than the TS packets may be processing units.

Moreover, the configurations, methods, processes, shapes, materials and numerical values described in the above embodiments can be combined with each other as long as the gist of the present disclosure is not departed.

REFERENCE SIGNS LIST

1 Base station
2, 2a to 2d Terminal
3 Local network
13 Information packet storage unit
14 A/V decoding unit
16 Parity packet storage unit
17 Parity sharing error control unit
22 Information packet identification information assigning unit
24 Information packet storage unit
25 Decoding processing unit
26 Parity packet storage unit
27 Check node storage unit
28 Control unit
31 Parity packet input unit
32 Encoding processing unit
33 Information packet output unit

The invention claimed is:

1. A communication device comprising:
a receiving device that receives an information packet transmitted from a base station;
a communication device that connects to a local network for sharing information among a plurality of terminals;
a generating device that generates a parity packet; and
a multicasting device that broadcasts the generated parity packet, a coding vector, and identification information of all source packets to the local network.

2. The communication device according to claim 1, wherein
a plurality of information packets is selected from information packets which could have been received correctly or could have been recovered, and error correction coding (ECC) is performed on the selected information packets to generate one or a plurality of the parity packets.

3. The communication device according to claim 1, wherein
one or a plurality of information packets is selected from information packets which could have been received correctly or could have been recovered, and an exclusive logical sum of respective bits of the selected information packet is calculated to generate the parity packet.

4. The communication device according to claim 3, wherein
one or a plurality of source packets to be used for generation of the parity packet is selected randomly.

5. The communication device according to claim 1, wherein
one or a plurality of information packets and a parity packet having been generated already are selected, and an exclusive logical sum of respective bits of the packets is calculated to generate the parity packet.

6. The communication device according to claim 5, wherein
when the source packet is selected randomly, a selection probability is changed according to the number of previous selections.

7. The communication device according to claim 1, wherein
generation source information of a parity packet which has been transmitted only is multicast on the local network.

8. The communication device according to claim 1, wherein
a sequence number or a timestamp in an information packet is used as the identification information of the source information packet.

9. The communication device according to claim 1, wherein
the identification information of the source information packet is generated from a PCR value of MPEG2-TS.

10. The communication device according to claim 1, wherein
the identification information of the source information packet is generated from a continuity counter of an MPEG2-TS packet header.

11. The communication device according to claim 1, wherein
the identification information of the source information packet is generated by combining PCR values of a plurality of programs multiplexed in MPEG2-TS and continuity counters of a plurality of PIDs.

12. The communication device according to claim 5, wherein
the identification information of the source parity packet is generated from information unique to a parity packet generation device and the number of parity packets having been generated already by the terminal.

13. The communication device according to claim 1, wherein
a packet having the same identification information as the source packet of a received parity packet is retrieved from the storage unit, and if there is only one lost packet in the source packets, a lost packet is recovered by calculating an exclusive logical sum of the received parity packet and other source packets.

14. A communication device comprising:
a receiving device that receives an information packet transmitted from a base station;
a receiving device that receives a parity packet multicast by other terminals and identification information of all source packets via a local network;
a memory that stores the received parity packet and the identification information of all source packets in a storage unit; and
a recovery device that recovers a lost packet using the parity packet, a coding vector, and the identification information of all source packets.

15. A communication device comprising:
a receiving device that receives an information packet transmitted from a base station;
a communication device that connects to a local network for sharing information among a plurality of terminals;
a generating device that generates a parity packet;
a multicasting device that broadcasts the generated parity packet and identification information of all source packets to the local network;
a receiving device that receives the parity packet multicast by other terminals and the identification information of all source packets via the local network;
a memory that stores the received parity packet and the identification information of all source packets in a storage unit; and
a recovery device that recovers a lost packet using the parity packet, a coding vector, and the identification information of all source packets.

16. A communication system comprising:
a plurality of terminals that receives an information packet multicast or broadcast from a base station; and
a network for sharing information among the plurality of terminals, wherein
the plurality of terminals shares a parity packet by mutually transmitting and receiving the parity packet a plurality of times so that an information packet which could not have been received correctly by respective terminals is recovered using a coding vector; wherein
one or a plurality of terminals of the plurality of terminals is a first communication device that generates and transmits a parity packet only and the other terminals are second communication devices,
the first communication device includes:
a receiving device that receives an information packet transmitted from a base station;
a communication device that connects to a local network for sharing information among a plurality of terminals;
a generating device that generates the parity packet; and
a multicasting device that broadcasts the generated parity packet, a coding vector, and identification information of all source packets to the local network, and
the second communication device includes:
a receiving device that receives an information packet transmitted from the base station;
a receiving device that receives the parity packet multicast by the first communication device and identification information of all source packets via the local network;
a memory that stores the received parity packet and the identification information of all source packets in a storage unit; and
a recovery device that recovers a lost packet using the parity packet, a coding vector, and the identification information of all source packets.

17. The communication system according to claim 16, wherein
each of the plurality of terminals includes:
a device that receives receiving an information packet transmitted from a base station;
a communication device that connects to a local network for sharing information between a plurality of receiving terminals;
a generating device that generates a parity packet;
a multicasting device that broadcasts the generated parity packet and identification information of all source packets to the local network;
a receiving device that receives the parity packet multicast by other terminals and identification information of all source packets via the local network;
a memory that stores the received parity packet and the identification information of all source packets in a storage unit; and
a recovery device that recovers a lost packet using the parity packet, a coding vector, and the identification information of all source packets.

18. A communication method comprising:
allowing a plurality of terminals to receive an information packet multicast or broadcast from a base station so that information is shared among the plurality of terminals via a network; and allowing the plurality of terminals to share a parity packet by mutually transmitting and receiving the parity packet a plurality of times so that an information packet which could not have been received correctly by respective terminals is recovered using a coding vector; wherein one or a plurality of terminals of the plurality of terminals is a first communication device that generates and transmits a parity packet only and the other terminals are second communication devices, the first communication device includes:

a receiving device that receives an information packet transmitted from a base station;

a communication device that connects to a local network for sharing information among a plurality of terminals;

a generating device that generates the parity packet; and a multicasting device that broadcasts the generated parity packet, a coding vector, and identification information of all source packets to the local network, and the second communication device includes:

a receiving device that receives an information packet transmitted from the base station;

a receiving device that receives the parity packet multicast by the first communication device and identification information of all source packets via the local network;

a memory that stores the received parity packet and the identification information of all source packets in a storage unit; and a recovery device that recovers a lost packet using the parity packet, a coding vector, and the identification information of all source packets.

19. A non-transitory computer readable storage medium having computer readable instructions stored thereon, that, when executed by a computer, cause the computer to execute a communication method comprising:

receiving an information packet transmitted from a base station;

connecting to a local network for sharing information among a plurality of terminals;

generating a parity packet;

multicasting the generated parity packet and identification information of all source packets to the local network;

receiving the parity packet multicast by other terminals and the identification information of all source packets via the local network;

storing the received parity packet and the identification information of all source packets in a storage unit; and recovering a lost packet using the parity packet, a coding vector, and the identification information of all source packets.

* * * * *